United States Patent [19]

Tanoue et al.

[11] Patent Number: 5,469,417
[45] Date of Patent: Nov. 21, 1995

[54] INFORMATION RECORDING/REPRODUCING APPARATUS FOR RECORDING OR REPRODUCING DATA, AND CLOCK GENERATING CIRCUIT INFORPORATED THEREIN

[75] Inventors: Koki Tanoue, Yokohama; Tsuneshi Yokota, Kawasaki; Tomohisa Yoshimaru, Yokohama, all of Japan

[73] Assignee: Kabushiki Kaisha Toshiba, Kawasaki, Japan

[21] Appl. No.: 214,217

[22] Filed: Mar. 17, 1994

[30] Foreign Application Priority Data

Sep. 22, 1993 [JP] Japan ................................. 5-278944

[51] Int. Cl.[6] ........................................................ G11B 7/00
[52] U.S. Cl. ........................... 369/50; 369/47; 369/48; 369/58; 369/32
[58] Field of Search ................................. 369/50, 49, 48, 369/47, 58, 54, 59, 32, 124

[56] References Cited

U.S. PATENT DOCUMENTS

| 4,672,595 | 6/1987 | Senso ................................ 369/50 |
| 5,210,733 | 5/1993 | Yamaguchi et al. .................. 369/48 |
| 5,327,300 | 7/1994 | Satomura .......................... 369/47 X |

FOREIGN PATENT DOCUMENTS 61-77420  4/1986  Japan .

Primary Examiner—Georgia Y. Epps
Assistant Examiner—Muhammad N. Edun
Attorney, Agent, or Firm—Cushman, Darby & Cushman

[57] ABSTRACT

An optical disk apparatus records data on an optical disk or reproduces data therefrom. The optical disk has a plurality of zones each including a plurality of tracks, and the optical disk apparatus records or reproduces data with respect to the zones on the basis of clock signals having different frequencies. The optical disk apparatus comprises first and second phase comparators. The first phase comparator is a pull-in type and outputs a signal corresponding to the phase difference between a clock signal generated by a PLL circuit and a binary signal of reproduction data. The second phase comparator is a lock-in type and outputs a signal corresponding to the phase difference between a signal obtained by frequency-dividing the clock signal generated by the PLL circuit and a signal obtained by frequency-dividing a fundamental clock signal. When data is to be recorded or when the timings at which the PLL circuit outputs clock signals are not appropriate, the clock signals of the PLL circuit are processed by a voltage controlled oscillator in accordance with a signal supplied from the pull-in type first phase comparator. When data is to be reproduced, the clock signals of the PLL circuit are processed by the same voltage controlled oscillator in accordance with a signal supplied from the lock-in type second phase comparator.

2 Claims, 14 Drawing Sheets

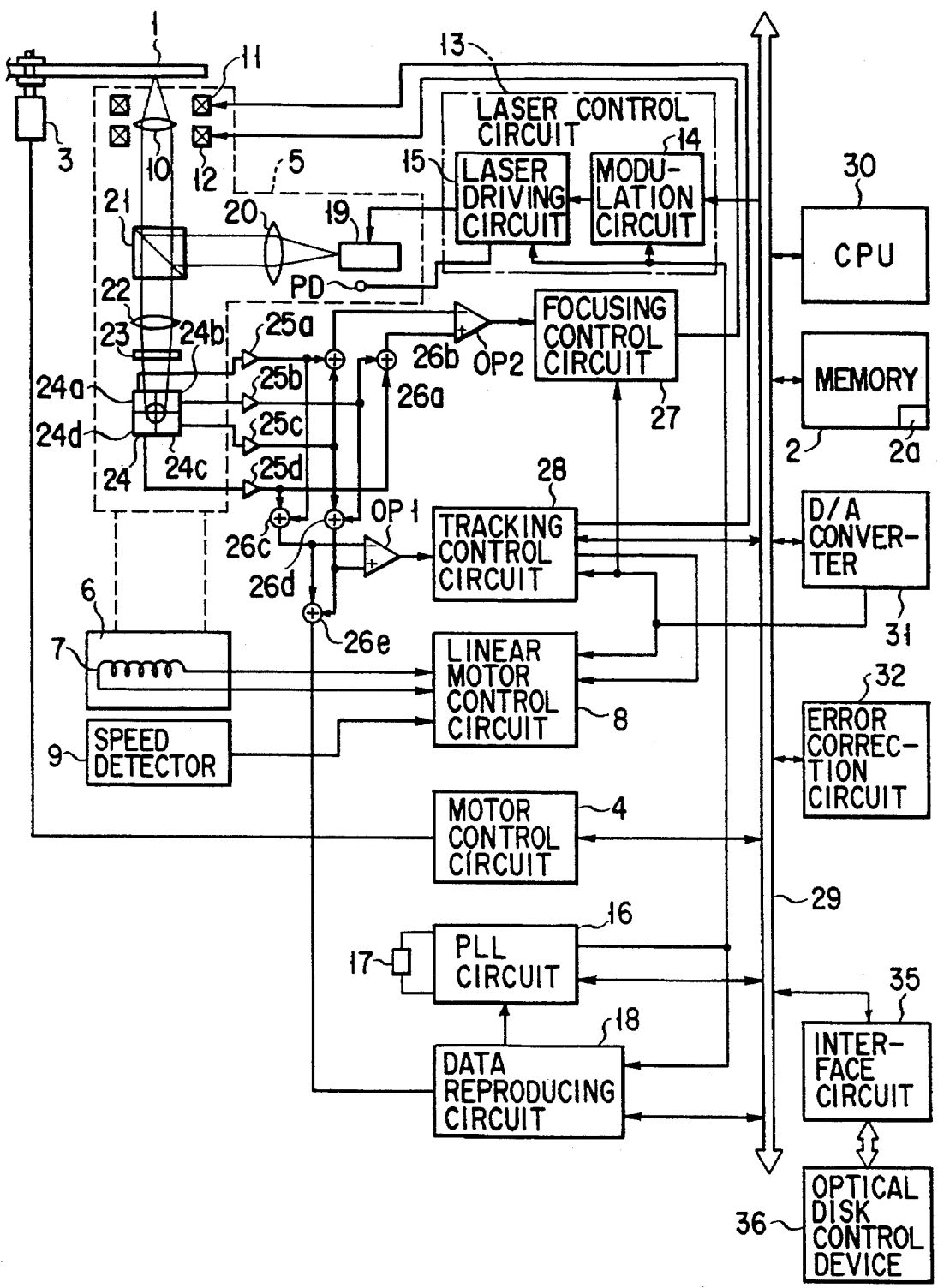
F I G. 1

| ZONE NUMBER | SECTORS/ CIRCUMFERENCE | CLOCK FREQUENCY VALUE (FREQUENCY DIVIDING VALUE) |
|---|---|---|
| 1 | 30 | |
| 2 | 31 | |
| 3 | 32 | |
| 4 | 33 | |
| ⋮ | ⋮ | ⋮ |
| 19 | 48 | |

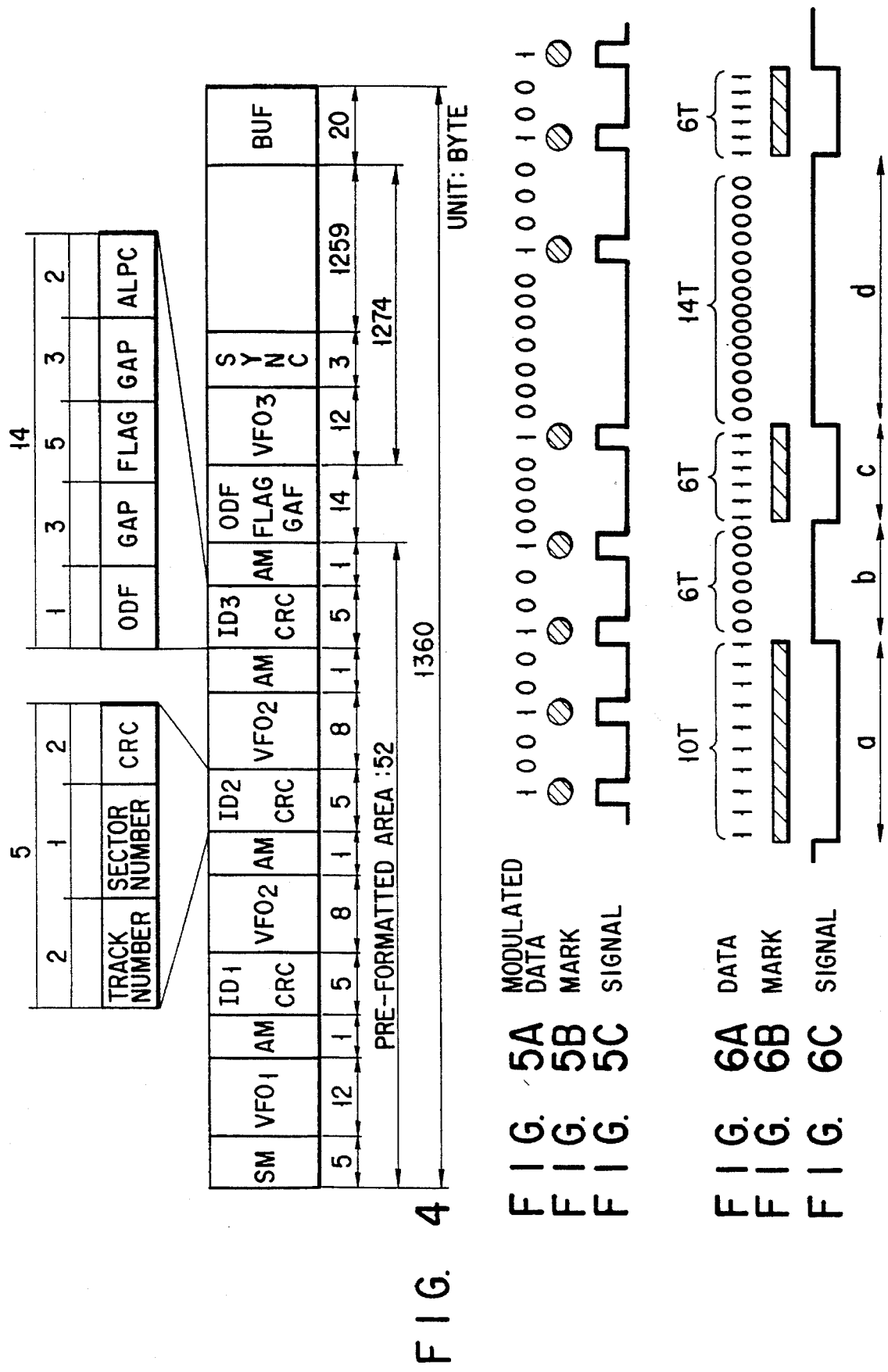

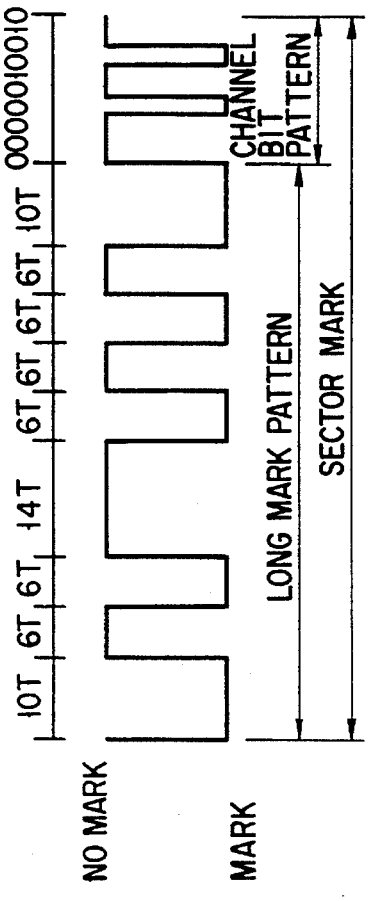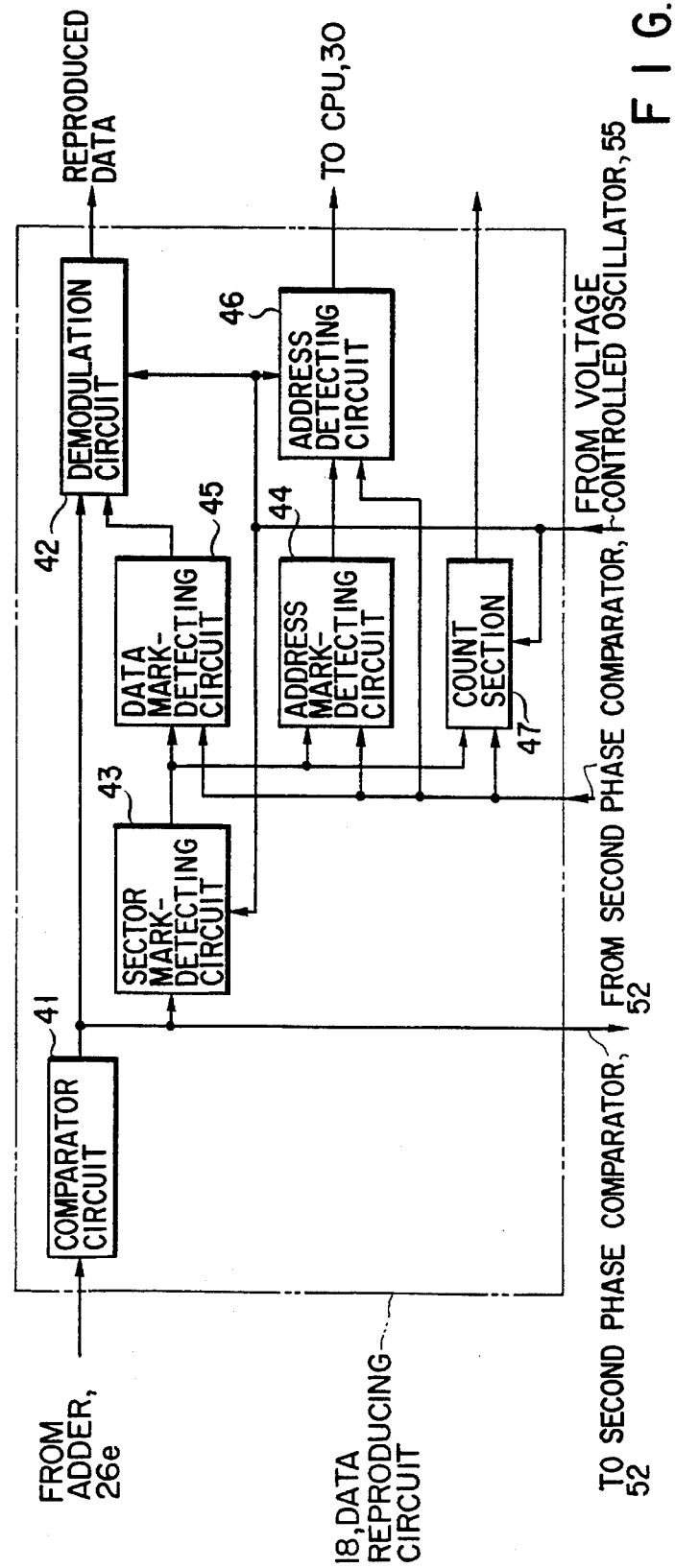

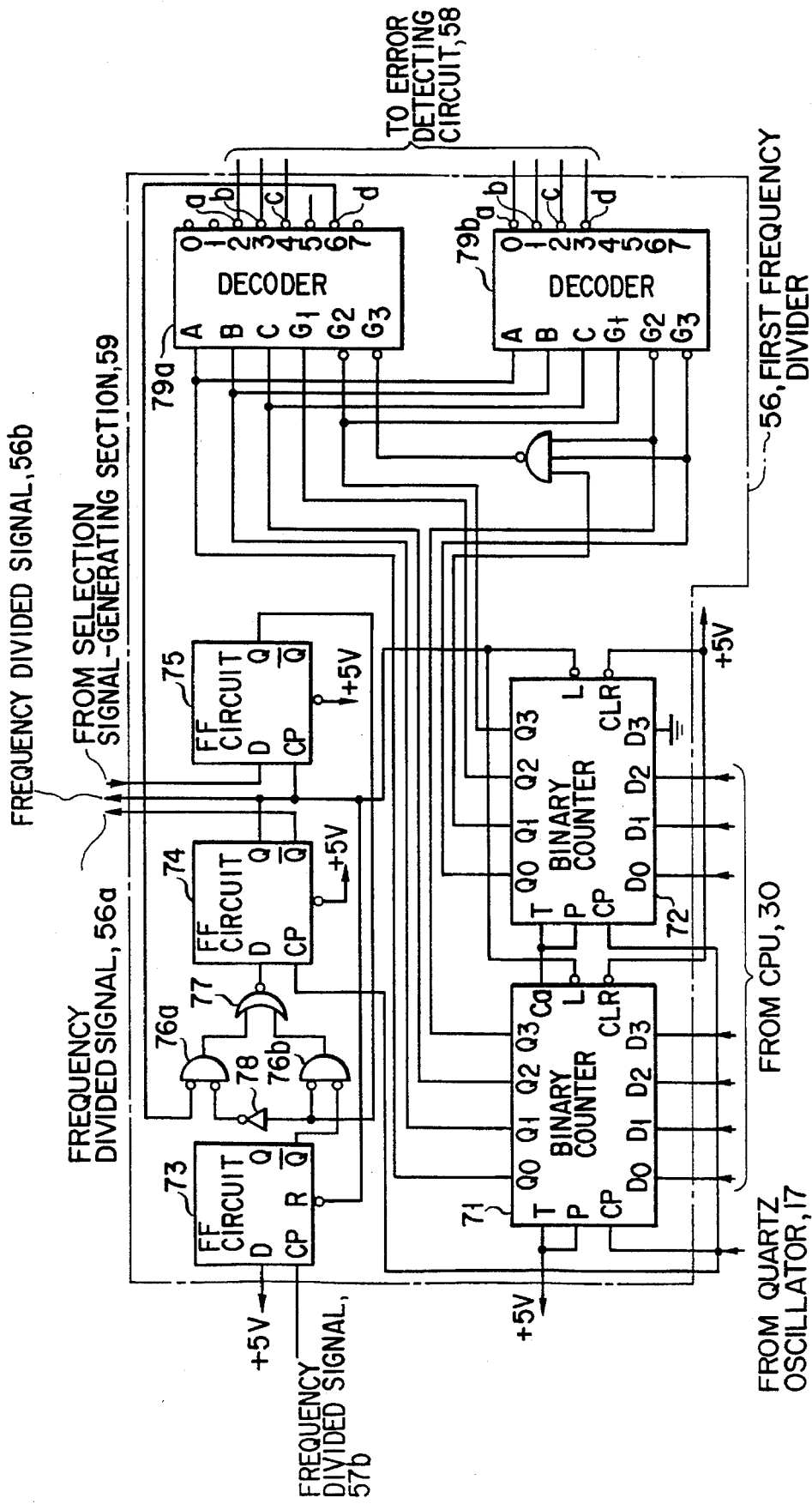
F I G. 12

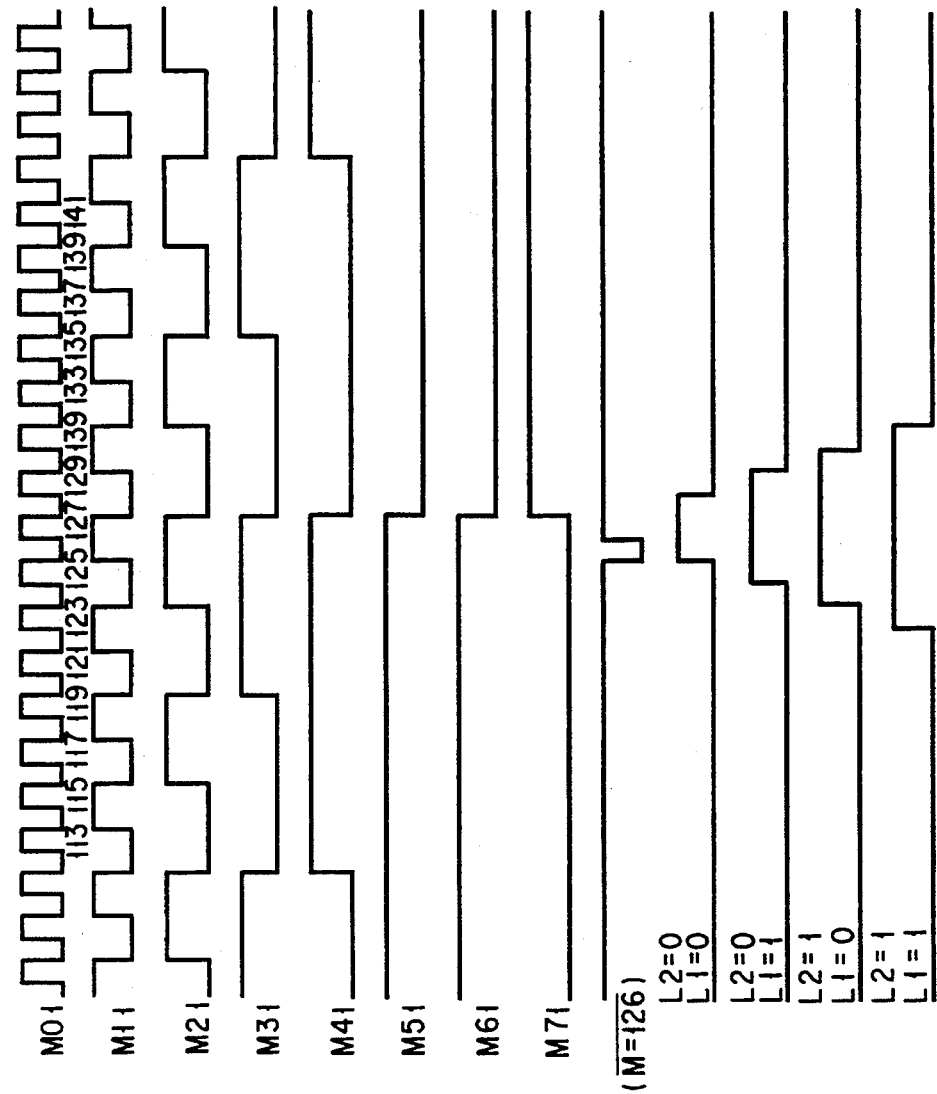

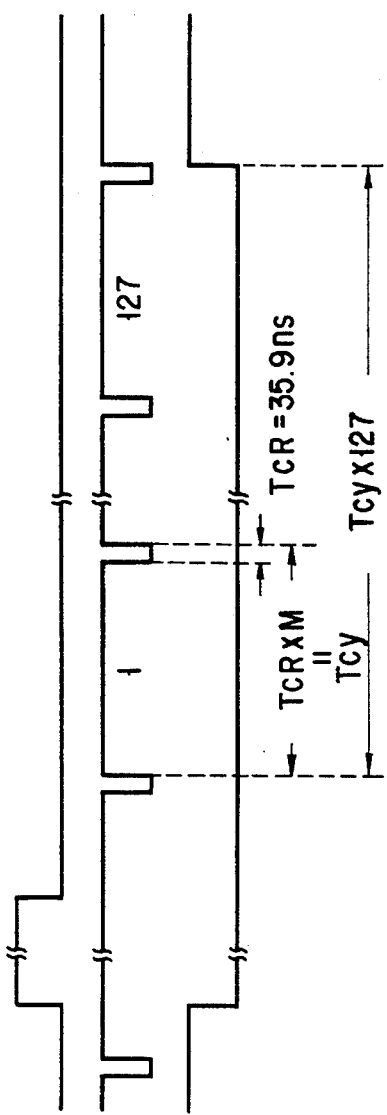
FIG. 18A FROM NAND CIRCUIT, 104
FIG. 18B FREQUENCY DIVIDED SIGNAL, 57b
FIG. 18C ERROR DETECTION SIGNAL
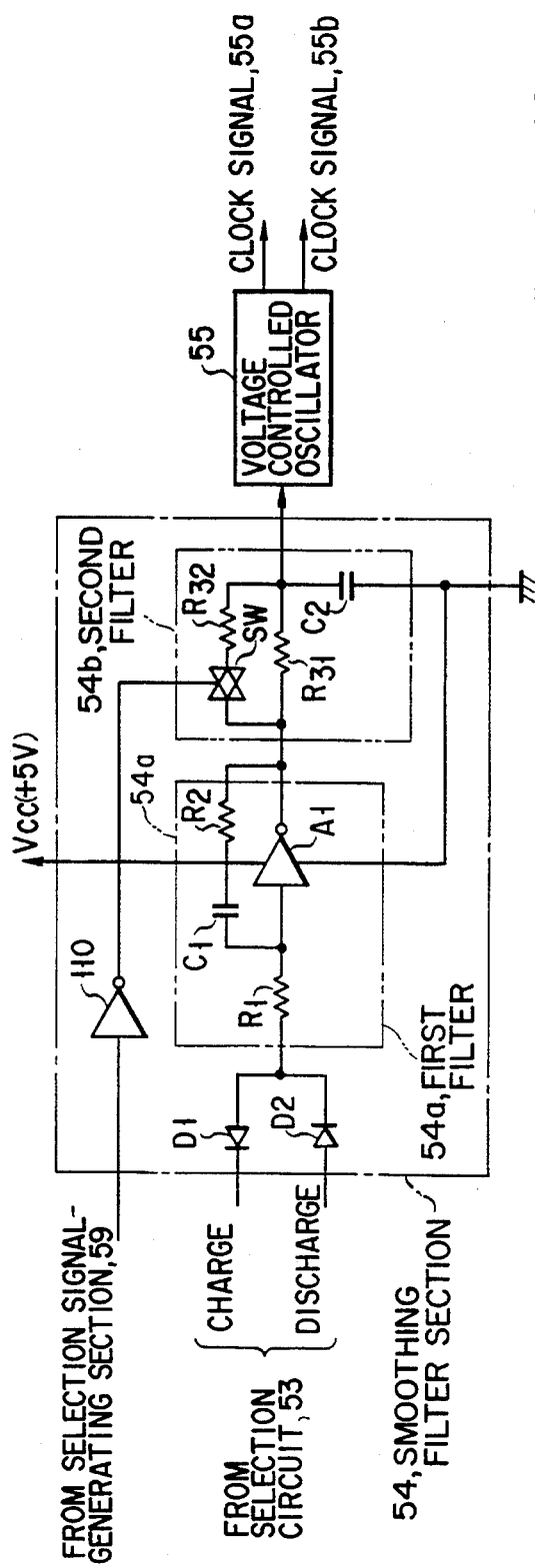
FIG. 19

INFORMATION RECORDING/REPRODUCING APPARATUS FOR RECORDING OR REPRODUCING DATA, AND CLOCK GENERATING CIRCUIT INFORPORATED THEREIN

BACKGROUND OF THE INVENTION

1. Field of the Invention

The present invention relates to an information recording/ reproducing apparatus incorporated in an optical disk apparatus or the like. The information recording/reproducing apparatus records data on an optical disk comprising a number of zones each having a number of tracks, and reproduces data from the optical disk. When data is recorded in the zones and when it is reproduced from the zones, clock signals having different frequencies corresponding to the respective zones are used.

2. Description of the Related Art

An optical disk is divided into a number of zones each having a number of tracks. In one zone, the number of sectors provided for one track is equal to the number of sectors provided for another track, but the number of sectors provided for each track of one zone differs from the number of sectors provided for each track of another zone. When data is recorded on the optical disk or reproduced therefrom, the optical disk is rotated at a constant speed, and an optical head records or reproduces the data on the basis of clock signals having different frequencies corresponding to the respective zones. The optical head is movable in the radial direction of the optical disk so that data can be recorded on a target track or reproduced therefrom.

An optical disk apparatus employs two PLL (phase locked loop) circuits, one for generating recording clock signals, i.e., timing clocks which are used for data recording, and the other for generating reproducing clock signals, i.e., timing clocks used for data identification when the data read out from the optical disk is reproduced. Each of the recording and reproducing PLL circuits comprises a phase comparator, a filter, and a voltage controlled oscillator (VCO).

However, if the two PLL circuits are incorporated in a single LSI circuit, the voltage controlled oscillators of the PLL circuits may interfere with each other, result in the generation of noise.

SUMMARY OF THE INVENTION

An object of the present invention is to provide an optical disk apparatus which records and reproduces data with reference to an optical disk, comprising a number of zones each having a number of tracks, on the basis of clock signals having different frequencies corresponding to the respective zones, in which a single voltage controlled oscillator is shared by both recording and reproducing PLL circuits, and in which the recording and reproducing circuits are incorporated in one large-scale integration (LSI) circuit. Another object of the present invention is to provide PLL circuits which are suitable for incorporation in the optical disk apparatus mentioned above, and which are small in size, consumes only a small amount of power and generates little noise.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is block circuit diagram showing an optical disk apparatus according to one embodiment of the present invention;

FIG. 4 shows an example of how a sector is formatted;

FIGS. 5A–5C show how data is recorded in a sector;

FIGS. 6A–6C and FIGS. 7A–7B show the pattern of a sector mark;

FIG. 8 is a block circuit diagram showing the configuration of the data reproducing circuit depicted in FIG. 1;

FIG. 12 is a block circuit diagram showing an example of a specific configuration of the first frequency divider depicted in FIG. 9;

FIGS. 17A–17M and FIGS. 18A–18C show the waveforms at the major portions of the first frequency divider depicted in FIG. 12, and also show the waveforms at the major portions of the frequency abnormality-sensing circuit depicted in FIG. 16; and FIG. 19 is a circuit diagram showing an example of a specific configuration of the smoothing filter depicted in FIG. 9.

DETAILED DESCRIPTION OF THE PREFERRED EMBODIMENTS

An embodiment of the present invention will now be described with reference to the accompanying drawings.

FIG. 1 shows an optical disk apparatus according to one embodiment of the present invention. The optical disk apparatus records and reproduces data with respect to an optical disk 1, using a convergent light beam.

The optical disk 1 is obtained by preparing a circular substrate formed of glass or plastics and forming a metal coating layer of tellurium, bismuth, or the like on the surface of the substrate.

Figures 2, 3:
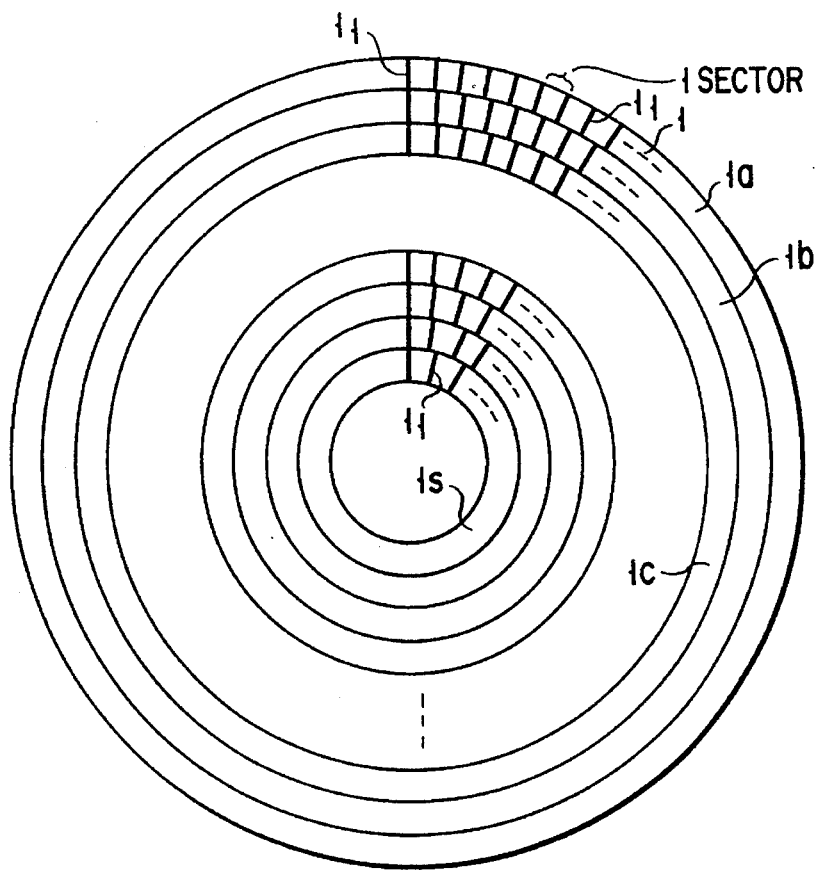
FIG. 2 is a diagram showing an example of how an optical disk is formatted.
FIG. 3 shows the frequencies of the clock signals used for the respective zones.

As is shown in FIG. 2, the optical disk 1 is divided into a plurality of zones $1a, 1b \ldots 1s$ (e.g., nineteen zones), each having a plurality of tracks. The clock signals used for the zones $1a, 1b \ldots 1s$ have different frequencies (to be specific, the clock signals increase in frequency from the innermost zone to the outermost zone). The number of sectors provided for one track differs, depending upon the zones. The relationships between the frequency dividing values corresponding to the frequencies of the clock signals used for the zones $1a, 1b \ldots 1s$ and the number of sectors provided for one track are stored in the table $2a$ of a memory 2, as shown in FIG. 3.

In each track of each of the zones $1a, 1b \ldots 1s$ of the optical disk 1, a header $1_1$ for storing an address or the like is pre-formatted for each sector.

The format of each of the sectors of the zones $1a, 1b \ldots 1s$ of the optical disk 1 is illustrated in FIG. 4. The format illustrated in FIG. 4 is a sector format based on to a continuous-servo tracking system (composite continuous tracking system) which detects a tracking error signal by a push-pull method. The format meets the standards of ISO (the International Organization for Standardization, 1990).

Referring to FIG. 4, one sector has a capacity of 1,360 bytes and is made up of a 52-byte pre-formatted area (which corresponds to a header $1_1$), a 14-byte offset detection flag (ODF) area, a 1,274-byte data area, and a 20-byte buffer area.

The data recorded in the sector mentioned above is data subjected to 2-7 code modulation, and two to seven "0"s are inserted between "1" and "1", as indicated in FIGS. 5A–5C.

The pre-formatted area is an area in which predetermined data is recorded when the optical disk is manufactured. The pre-formatted area is made up of the following areas: a 5-byte sector mark SM, three synchronization code sections VFO (one is a 12-byte section, and the other two are 8-byte sections), three 1-byte address marks AM, three 5-byte address sections ID, and a 1-byte post amble PA.

In the area of the sector mark SM, a special pattern indicating the start of the sector is recorded. In the area of the synchronization code sections, a continuous data pattern (i.e., a synchronization code) for PLL locking is recorded. In the area of the address mark AM, a special pattern indicating the start of an address is recorded. In the area of the address sections ID, a 2-byte track number, a 1-byte sector number and a 2-byte error correction code are recorded. The post amble PA is used when the error correction code of the address sections exceeds 2 bytes.

In the area of the sector mark SM, marks (which look like continuous "1"s) are actually formed, as indicated in FIGS. 6A–6C, 7A and 7B.

The sector mark pattern recorded in the sector mark area is made up of a long-mark pattern corresponding to reproducing clocks A, and a channel bit pattern "0000010010". The number of reproducing clocks A is ten in interval a, six in interval b, fourteen in interval c, six in intervals e–h, and 10 in interval i.

Figure 14:
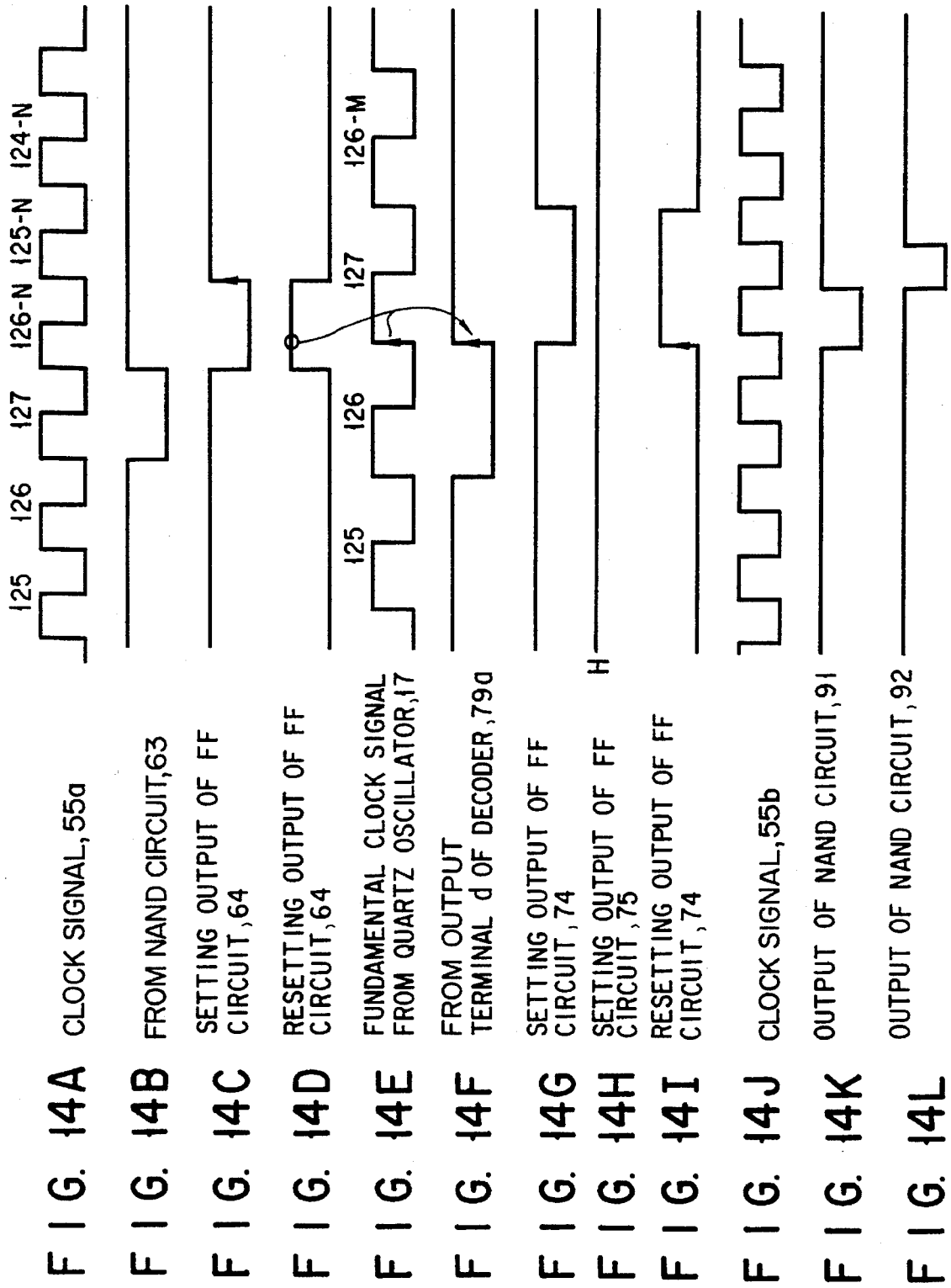
FIGS. 14A–14L show the waveforms at the major portions of the first frequency divider depicted in FIG. 12, and also show the waveforms at the major portions of the selection circuit depicted in FIG. 13.

The 14-byte offset detection flag (ODF) area shown in FIG. 14 is made up of the following areas: a 1-byte area for an offset detection flag ODF (which is an offset-detecting mark used in the tracking error detection of the push-pull method); a 3-byte gap GAP; a 5-byte area for a flag FLAG indicating a data-written state; a 3-byte gap GAP; and a 2-byte area for auto laser power control ALPC.

The gap GAP is an area where no data is recorded.

The data area is made up of: a 12-byte synchronization code section VFO, a 3-byte data mark SYNC, and a 1,259-byte data section. In the area of the synchronization code section VFO, a synchronization code for PLL locking is recorded. In the area of the data mark SYNC, a special pattern indicating the start of the data section is recorded. In the data section, user's data is recorded as well as an error correcting code (ECC), a cyclic redundancy check code (CRC), a special synchronization code, etc.

The buffer area is an area for a rotational variation margin.

The optical disk 1 shown in FIG. 1 is rotated by a motor 3 at a constant speed, for example. The motor 3 is controlled by a motor control circuit 4.

Turning now to FIG. 1, information is recorded or reproduced from the optical disk 1 by means of an optical head 5. The optical head 5 is secured to a driving coil 7 which constitutes the rotor of a linear motor 6. The driving coil 7 is connected to a linear motor control circuit 8.

A speed detector 9 is connected to the linear motor control circuit 8. A speed signal representing the speed of the optical head 5 is supplied to the linear motor control circuit 8.

A permanent magnet (not shown) is provided for the stator of the linear motor 6. When the driving coil 7 is magnetized by the linear motor control circuit 8, the optical head 5 is moved in the radial direction of the optical disk 1.

In the optical head 5, an objective lens 10 is supported by either a wire (not shown) or a leaf spring (not shown). The objective lens 10 is moved in the tracking direction (i.e., in the direction perpendicular to the optical axis of the lens) by means of a driving coil 11, and moved in the focusing direction (i.e., in the direction of the optical axis of the lens) by means of a driving coil 12.

A semiconductor laser oscillator 19 is driven by a laser control circuit 13 and generates a laser beam. The laser control circuit 13 comprises a modulation circuit 14 and a laser driving circuit 15, and operates in synchronism with recording clock signals supplied from a PLL circuit 16.

The modulation circuit 14 modulates recording data supplied from an error correction circuit 32 (to be described later) such that the recording data is converted into 2-7 modulation data, i.e., a signal suitable for recording. The laser driving circuit 15 drives the semiconductor laser oscillator (or an argon neon laser oscillator) of the optical head 5 on the basis of the 2-7 modulation data obtained by the modulation circuit 14.

At the time of recording, the PLL circuit 16 produces a recording clock signal by dividing a fundamental frequency signal supplied from a quarts oscillator 17 in such a manner as to obtain a frequency corresponding to a recording position of the optical disk 1. At the time of reproduction, the PLL circuit 16 produces a reproducing clock signal corresponding to a reproduced synchronization code, and further senses a frequency error of the reproducing clock signal. The frequency error is sensed by checking whether or not the frequency of the reproducing clock signal is within the predetermined frequency range corresponding to the position at which the data to be recorded is recorded on the optical disk 1.

The PLL circuit 16 outputs either a recording clock signal or a reproducing clock signal in accordance with both a control signal supplied from a CPU 30 and a signal supplied from a count section 47 (to be described later) of a data reproducing circuit 18.

A laser beam generated by the semiconductor laser oscillator 19 (or argon neon laser oscillator) driven by the laser driving circuit 15 of the laser control circuit 13 is incident on the optical disk 1 after traveling through a collimator lens 20, a half prism 21 and the objective lens 10. The beam reflected by the optical disk 1 is guided to an optical detector 24 by way of the objective lens 10, the half prism 21, a condensing lens 22 and a cylindrical lens 23.

The optical detector 24 is a four-division type made up of light detecting cells 24a, 24b, 24c and 24d.

An output signal of light detecting cell 24a of the optical detector 24 is supplied through an amplifier 25a to one of two input terminals of an adder 26a. An output signal of light detecting cell 24b is supplied through an amplifier 25b to one of two input terminals of an adder 26b. An output signal of light detecting cell 24c is supplied through an amplifier 25c to the other input terminal of the adder 26a. An output signal of light detecting cell 24d is supplied through an amplifier 25d to the other input terminal of the adder 26b.

Further, the output signal of light detecting cell 24a is supplied through the amplifier 25a to one of two input terminals of an adder 26c. The output signal of light detecting cell 24b is supplied through the amplifier 25b to one of two input terminals of an adder 26d. The output signal of light detecting cell 24c is supplied through the amplifier 25c to the other input terminal of the adder 26c. The output signal of light detecting cell 24d is supplied through the amplifier 25d to the other input terminal of the adder 26d.

An output signal of adder 26a is supplied to the inverted input terminal of a differential amplifier OP2, and an output signal of adder 26b is supplied to the non-inverted terminal of the same differential amplifier OP2. In accordance with the difference between the output signals of adders 26a and 26b, the differential amplifier OP2 produces a signal representing the focusing point and supplies the signal to a focusing control circuit 27. An output signal of the focusing control circuit 27 is supplied to the driving coil 12 which moves the objective lens 10 in the focusing direction. Thus, the laser beam is in focus on the optical disk 1 at all times.

An output signal of adder 26c is supplied to the inverted input terminal of a differential amplifier OP1, and an output signal of adder 26d is supplied to the non-inverted terminal of the same differential amplifier OP1. In accordance with the difference between the output signals of adders 26c and 26d, the differential amplifier OP1 produces a track difference signal and supplies this signal to a tracking control circuit 28. In accordance with the track difference signal supplied from the differential amplifier OP1, the tracking control circuit 28 produces a track driving signal.

The track driving signal output from the tracking control signal 28 is supplied to the driving coil 11 which moves the objective lens 10 in the tracking direction. The track difference signal used in the tracking control circuit 28 is supplied to the linear motor control circuit 8.

The sum signal of the outputs which the light detecting cells 24a–24d of the optical detector 24 produce in the state where focusing and tracking are executed in the above manner, that is, the sum signal which an adder 26e produces after adding the output signals of adders 26c and 26d, bears information reflecting the reflection factors of the pits formed in the track 1. The sum signal is supplied to the data reproducing circuit 18, and the data reproducing circuit 18 reproduces recorded data in accordance with the reproducing clock signal supplied from the PLL circuit 16. Further, the data reproducing circuit 18 detects a sector mark included in the pre-formatted data on the basis of both the signal produced by adder 26e and the reproducing clock signal supplied from the PLL circuit 16. After the detection of the sector mark, the data reproducing circuit 18 reproduces address information (namely, a track number and a sector number) from the binary signal supplied from the PLL circuit 16 on the basis of the reproducing clock signal.

The data reproduced by the data reproducing circuit 18 is supplied to the error correction circuit 32 by way of a bus 29. The error correction circuit 32 corrects an error in accordance with the error correction code ECC included in the reproduced data. The error correction circuit 32 also attaches an error correction code ECC to recording data supplied from an interface circuit 35, and then supplies the recording data to the memory 2. 10 After the error correction, the reproduced data is supplied to an optical disk control device 36 (i.e., an external device) by way of the bus 29 and the interface circuit 35. From the optical disk control device 36, recording data is supplied to the error correction circuit 32 by way of the interface circuit 35 and the bus 29.

When the objective lens 10 is moved under the control of the tracking control circuit 28, the linear motor control circuit 8 drives the linear motor 6 and moves the optical head 5 such that the objective lens 10 is located in the neighborhood of the center of the optical head 5.

The subject optical disk apparatus comprises a D/A converter 31 used for information exchange between the CPU 30 (which controls the entire optical disk apparatus) and each of the focusing control circuit 27, the tracking control circuit 28, and the linear motor control circuit 8.

The motor control circuit 4, the linear motor control circuit 8, the laser control circuit 13, the PLL circuit 16, the data reproducing circuit 18, the focusing control circuit 27, the tracking control circuit 28, the error correction circuit 32, etc. are connected to the CPU 30 through the bus 29 and are controlled by the CPU 30. The CPU 30 operates in a predetermined manner on the basis of the program stored in the memory 2.

As is shown in FIG. 8, the data reproducing circuit 18 described above comprises a comparator circuit 41, a demodulation circuit 42, a sector mark-detecting circuit 43, an address mark-detecting circuit 44, a data mark-detecting circuit 45, an address detecting circuit 46 and a count section 47.

The comparator circuit 41 converts the sum signal from the adder 26e into a binary signal. The binary signal is supplied from the comparator circuit 41 to each of the following: the sector mark-detecting circuit 43, the address mark-detecting circuit 44, the data mark-detecting circuit 45, the address detecting circuit 46 and the count section 47.

After receiving a data mark detection signal from the data mark-detecting circuit 45, the demodulation circuit 42 demodulates the binary signal from the comparator circuit 41 by 2-7 code reverse conversion on the basis of the clock signal supplied from the PLL circuit 16.

The sector mark-detecting circuit 43 detects the sector mark SM mentioned above on the basis of both the binary signal supplied from the comparator circuit 41 and the clock signal supplied from the PLL circuit 16. The sector mark-detecting circuit 43 is constituted by a pattern detecting circuit made up of a register and a comparator (neither is shown). A sector mark detection signal output from the sector mark-detecting circuit 43 is supplied to each of the following: the address mark-detecting circuit 44, the data mark-detecting circuit 45, the count section 47, and a selection signal-generating section 59 incorporated in the PLL circuit 16.

After the sector mark detection mentioned above, the address mark-detecting circuit 44 detects an address mark in accordance with both a binary signal produced by a second phase comparator 52 (to be described later) of the PLL circuit 16 and the clock signal supplied from the PLL circuit 16. The address mark-detecting circuit 44 is made up of a register and a comparator (neither is shown). An address mark detection signal output from the address mark-detecting circuit 44 is supplied to the address detecting circuit 46.

After the sector mark detection mentioned above, the data mark-detecting circuit 45 detects a data mark in accordance with both the binary signal produced by the second phase comparator 52 of the PLL circuit 16 and the clock signal supplied from the PLL circuit 16. The data mark-detecting circuit 45 is made up of a register and a comparator (neither is shown). An data mark detection signal output from the data mark-detecting circuit 45 is supplied to the demodulation circuit 42.

After receiving the address mark detection signal from the address mark-detecting circuit 44, the address detecting circuit 46 reproduces address information (namely, a track number and a sector number) in accordance with both the binary signal produced by the second phase comparator 52 of the PLL circuit 16 and the clock signal supplied from the PLL circuit 16. The address detecting circuit 44 is made up of a register, a counter, a gate, a serial-parallel converter, etc. (none of which are shown).

The count section 47 is constituted by a counter (not shown) adapted to count the number of bytes. Upon reception of the sector mark detection signal from the sector mark-detecting circuit 43, the count section 47 starts a counting operation in accordance with the binary signal supplied from a phase comparator 51 of the PLL circuit 16. When the count section 47 counts the number of bytes which corresponds to the end position of the pre-formatted area (i.e., heater $1_1$), count section 47 supplies an end position signal to the selection signal-generating section 59 of the PLL circuit 16.

Figure 9:
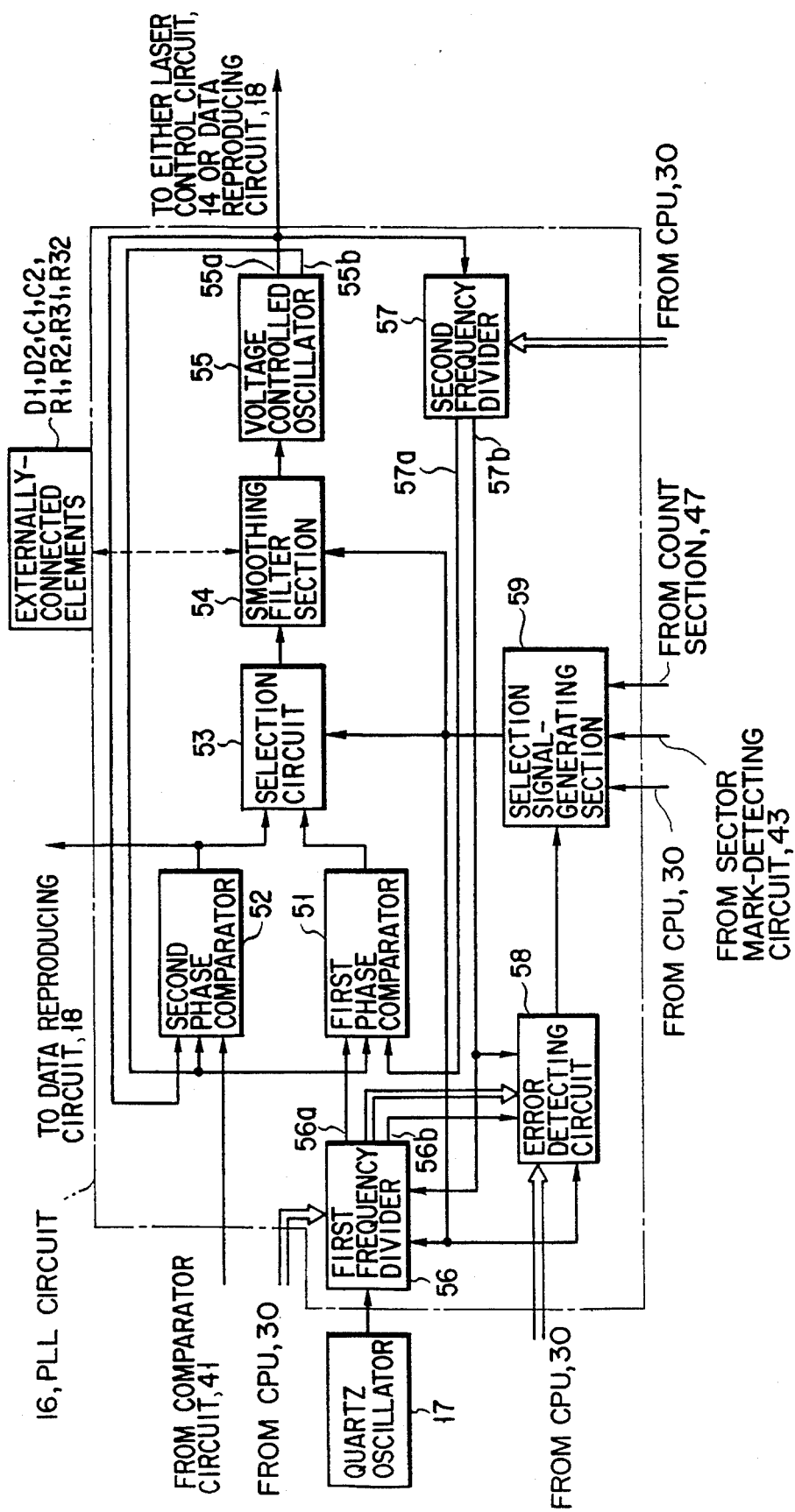
FIG. 9 is a block circuit diagram showing the configuration of the PLL circuit depicted in FIG. 1.

As is shown in FIG. 9, the PLL circuit 16 comprises first and second phase comparators 51 and 52, a selection circuit 53, a smoothing filter section 54, a voltage controlled oscillator 55, first and second frequency dividers 56 and 57, an error detecting circuit 58, and a selection signal-generating section 59.

The first phase comparator is a pull-in type phase comparator. It compares the phase of the signal supplied from the first frequency divider 56 with the phase of the signal supplied from the second frequency divider 57, and outputs a signal having a pulse width which is proportionate to the phase difference.

The second phase comparator 52 is a lock-in phase comparator. It compares the phase of the binary signal of the comparator circuit 41 of the data reproducing circuit 18 with the phase of the clock signal 55a of the voltage controlled oscillator 55, and outputs a signal having a pulse width which is proportionate to the phase difference.

The second phase comparator 52 can operate even when the binary signal supplied thereto from the comparator circuit 41 is in the "partly toothless state" wherein some of the regularly produced pulses are not present. Assuming that n represents an integer representing the number of clock signals supplied during the period of phase comparison, n is in the range of 3 to 8 in the case of a 2-7 code modulation signal.

The selection circuit 53 selects either a signal from the first phase comparator 51 or a signal from the second phase comparator 52 in accordance with the level of a selection signal supplied from the selection signal-generating section 59, and supplies the selected signal to the smoothing filter section 54. When the selection signal is at a low level, the selection circuit 53 selects the signal from the first phase comparator 51 and supplies this signal to the smoothing filter section 54. When the selection signal is at a high level, the selection circuit 53 selects the signal from the second phase comparator 52 and supplies this signal to the smoothing filter section 54.

The smoothing filter section 54 removes harmonic components from the signal output by the first or second phase comparator 51 or 52. The cut-off frequency of the smoothing filter section 54 is switched in value between the data recording time and the data reproducing time in response to the control signal supplied from the selection signal-generating section 59. The smoothing filter section 54 is of a complete integration type. At the time of data recording, the higher break frequency of the smoothing filter section 54 is switched to a value substantially ¹⁄₁₀ of the higher break frequency used at the time of data reproduction, thereby suppressing fluctuations.

The voltage controlled oscillator 55 is constituted by a CMOS and outputs two clock signals 55a and 55b. Clock signal 55a has a frequency proportional to the voltage (analog value) of the signal supplied from the smoothing filter section 54, while clock signal 55b has a phase shifted by 180 degrees from that of clock signal 55a. The voltage controlled oscillator 55 has a function which is equivalent, for example, to the function of 74LS624 commercially available from Texas Instruments Inc. Clock signal 55a is supplied to the second phase comparator 52 and the second frequency divider 57, while clock signal 55b is supplied to the first and second phase comparators 51 and 52 and the second frequency divider 57.

The first frequency divider 56 divides the fundamental frequency signal supplied from the quarts oscillator 17 and outputs two frequency divided signals 56a and 56b which are opposite in phase to each other. The frequency dividing ratio of the first frequency divider 56 is determined in accordance with 7-bit frequency dividing ratio-setting data (parallel data) supplied from the CPU 30. The first frequency divider 56 has such a period as is triggered in response to reception of a predetermined integer number of pulses supplied after the last effective triggering (subharmonic triggering).

Let it be assumed that the fundamental frequency signal supplied from the quarts oscillator 17 is 27.8 MHZ and that the optical disk 1 is a 3.5 inch type (90 mm type). In this case, the frequency dividing ratio is "48" when the rotating speed of the optical disk 1 is 3,000 rpm, and is "40" when the rotating speed of the optical disk 1 is 3,600 rpm. The frequency dividing ratio-setting data set by the CPU 30 is "1010000=50 H(Hex)" when the frequency dividing ratio is "48", and is "101000=58 H(Hex)" when the frequency dividing ratio is "40". The frequency dividing ratio and the frequency dividing ratio-setting data have complementary relationships. To be specific, the frequency dividing ratio-setting data is obtained by inverting the binary representation of the frequency dividing ratio and adding "1" to the resultant figure.

Frequency divided signal 56a of the first frequency divider 56 is supplied to the first phase comparator 51, while frequency divided signal 56b thereof is supplied to the error detecting circuit 58.

The first frequency divider 56 counts the number of fundamental frequency signals supplied from the quarts oscillator 17, and supplies a count signal 56*c* to the error detecting circuit 58. The count signal 56*c* is 8-bit parallel data.

The second frequency divider 57 divides the clock signal 55*a* supplied from the voltage controlled oscillator 55 and outputs two frequency divided signals 57*a* and 57*b* which are opposite in phase to each other. The frequency dividing ratio of the second frequency divider 57 is determined in accordance with 7-bit frequency dividing ratio-setting data (parallel data) supplied from the CPU 30. The second frequency divider 57 has such a period as is triggered in response to reception of a predetermined integer number of pulses supplied after the last effective triggering (subharmonic triggering).

For example, when the frequency dividing ratio-setting data supplied from the CPU 30 is "N6 to N0= 1110000B= 70 H(Hex)", the second frequency divider 57 has a period corresponding to sixteen clocks, and outputs only one frequency divided signal 57*a* corresponding to a low level during one period. Therefore, the frequency dividing ratio of the second frequency divider 57 is 16 (decimal notation).

The frequency dividing ratio "16" which the user would like to use and the frequency dividing ratio-setting data "N6 to N0= 1110000B= 70 H(Hex)" actually supplied from the CPU 30 have complementary relationships. To be specific, the frequency dividing ratio-setting data "1110000= 70 H(Hex)" is obtained by inverting the binary representation ("0010000") of the frequency dividing ratio "16" (decimal notation) and adding "1" to the resultant figure "1101111".

Frequency divided signal 57*a* of the second frequency divider 57 is supplied to the first phase comparator 51, while frequency divided signal 57*b* thereof is supplied to the first frequency divider 56.

The error detecting circuit 58 detects whether the clock signal output from the voltage controlled oscillator 55 contains an error or not, by use of both a check signal produced on the basis of the count signal 56*c* supplied from the first frequency divider 56 and the frequency divided signal 57*b* supplied from the second frequency divider 57. A detection signal of the error detecting circuit 58 is supplied to the selection circuit 53. The check signal is produced by the error detecting circuit 58 by use of the fundamental clock signal supplied from the quartz oscillator 17, and the width of the check signal is determined by a check signal width-setting signal supplied from the CPU 30. Whether or not the error detecting circuit 58 executes an error detection operation with reference to the frequency divided signal 57*b* supplied from the second frequency divider 57 is controlled in accordance with the control signal supplied from the CPU 30. The check signal width-setting signal from the CPU 30 is 2-bit parallel data.

The selection signal-generating section 59 is constituted by a logic circuit. It generates a selection signal used for selecting either a signal from the first phase comparator 51 or a signal from the second phase comparator 52, in accordance with the following: a detection signal supplied from the error detecting circuit 58; a control signal supplied from the CPU 30 and representing the data recording or reproduction time; a detection signal supplied from the sector mark-detecting circuit 43 of the data reproducing circuit 18; and an end position signal supplied from the count section 47 of the data reproducing circuit 18.

The selection signal-generating section 59 operates, for example, as follows: When it receives from the CPU a control signal representing the data recording time, it outputs a low-level selection signal for selecting the signal supplied from the first phase comparator 51. Thereafter, when it receives a detection signal from the sector mark-detecting circuit 43, it outputs a high-level selection signal for selecting the signal supplied from the second phase comparator 52. Thereafter, when it receives a signal from the count section 47, it outputs a low-level selection signal for selecting the signal supplied from the first phase comparator 51.

Further, when the selection signal-generating section 59 receives from the CPU 30 a control signal representing the data reproduction time, it outputs a low-level selection signal for selecting the signal supplied from the first phase comparator 51. Thereafter, when it receives a detection signal from the sector mark-detecting circuit 43, it outputs a high-level selection signal for selecting the signal supplied from the second phase comparator 52. Thereafter, when it receives a signal from the count section 47, it outputs a low-level selection signal for selecting the signal supplied from the first phase comparator 51. If it receives a detection signal from the error detecting circuit 58 when the signal from the second phase comparator 52 is being selected, then it outputs a low-level signal for selecting the signal supplied from the first phase comparator 51. When it does not receive the detection signal from the error detecting circuit 58, it again outputs a high-level selection signal for selecting the signal supplied from the second phase comparator 52.

The second phase comparator 52, the selection circuit 53, the smoothing filter section 54 and the voltage controlled oscillator 55 jointly constitute a PLL circuit for data reproduction. Likewise, the first and second frequency dividers 56 and 57, the first phase comparator 52, the selection circuit 53, the smoothing filter section 54 and the voltage controlled oscillator 55 jointly constitute a PLL circuit for data recording.

Each of the first phase comparator 51, the second phase comparator 52, the selection circuit 53, the voltage controlled oscillator 55, the first frequency divider 56, the s second frequency divider 57, the error detecting circuit 58 and the selection signal-generating section 59 can be formed by a CMOS, and further each of the inverter circuit, analog inversion type amplifier and analog switch incorporated in the smoothing filter section 54 can be formed by a CMOS. If, in this case, the resistor and the capacitor incorporated in the smoothing filter section 54 are made as externally-connected structural elements, the function that enables both data recording and data reproduction by use of a single voltage controlled oscillator can be realized in the form of an LSI circuit.

In the PLL circuit 16, the two types of phase comparators 51 and 52 (i.e., the pull-in type and the lock-in type) are selectively used between the data recording time and the data reproducing time, and the constants of the smoothing filter section 54 are partly changes between the two times. By so doing, the signal voltage controlled oscillator 55 can be used in common to the PLL circuit for data recording and the PLL circuit for data reproduction.

Figure 10:
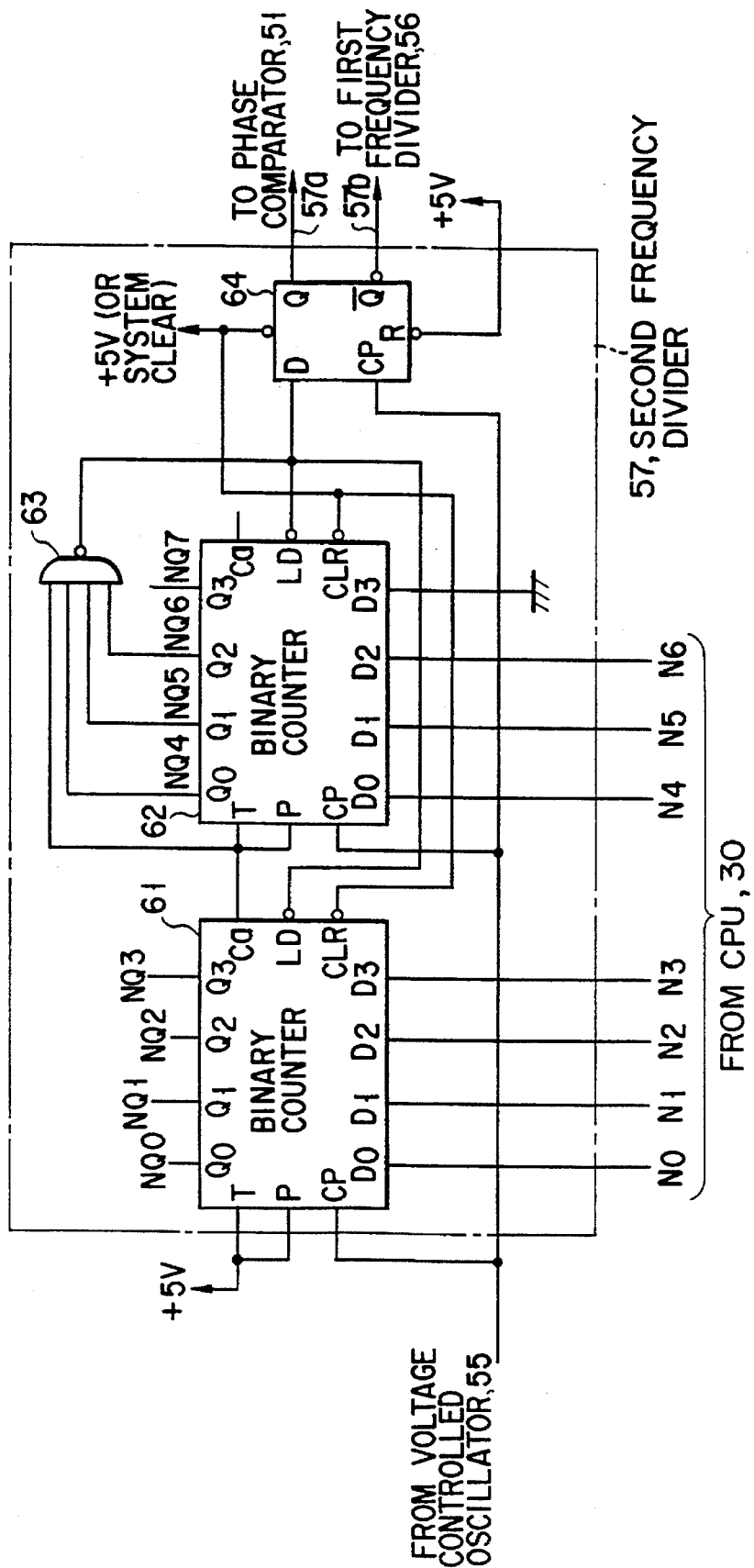
FIG. 10 is a block circuit diagram showing an example of a specific configuration of the second frequency divider depicted in FIG. 9.

As is shown in FIG. 10, the second frequency divider 57 is made up of a 4-bit binary counter 61, a 4-bit binary counter 62, a NAND circuit 63, and a D-type flip-flop circuit (FF circuit) 66.

Each of the binary counters 61 and 62 has a function which is equivalent, for example, to the function of TC74HC161 commercially available from Kabushiki Kaisha Toshiba.

Figure 11:
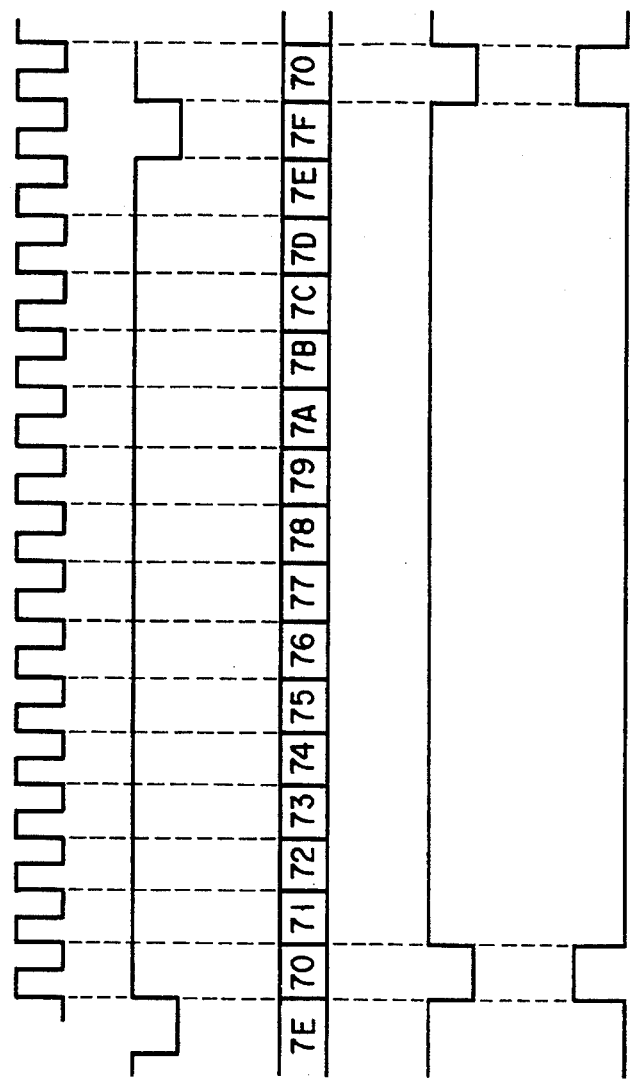
FIGS. 11A–11E show the waveforms at the major portions of the second frequency divider depicted in FIG. 9.

From the voltage controlled oscillator 55, a clock signal 55a, such as that shown in FIGS. 11A and 14A, is supplied to each of the clock pulse input terminals CP of the binary counters 61 and 62 and FF circuit 64.

From the CPU 30, frequency dividing ratio-setting data N6 . . . N0 (1110000B (binary)= 70 H (Hex)) are supplied to the data input terminals of D2, D1 and D0 of binary counter 62 and to the data input terminals D3, D2, D1 and D0 of binary counter 61. By these frequency dividing ratio-setting data N6 . . . N0, the output terminals Q2, Q1 and Q0 of binary counter 62 are made active.

Each of binary counters 61 and 62 counts up each time a clock signal 55a is supplied thereto from the voltage controlled oscillator 55, and how each binary counter counts is shown in FIG. 11C.

Outputs from the output terminals Q0, Q1, Q2, T and P of binary counter 62 are supplied to the NAND circuit 63. An output from this NAND circuit 63 (the output being shown in FIGS. 11B and 14B) is supplied to the load terminals LD of binary counters 61 and 62 and to the data input terminal D of the FF circuit 64.

A setting output of the FF circuit 64 (the setting output being shown in FIGS. 11D and 14C) is supplied to the first phase comparator 51 as a frequency divided signal 57a, while a resetting output of the FF circuit 64 (the resetting output being shown in FIGS. 11E and 14D) is supplied to the first frequency divider 56 as a frequency divided signal 57b.

A power voltage (+5 V) is supplied to the clear terminals CLR of binary counters 61 and 62 and to the power supply terminal of the FF circuit 64. The power voltage gradually increases in level to +5 V a certain time after its supply is started, and maintains at +5 V until its supply is stopped.

In the above configuration, the second frequency divider 57 receives the clock signal shown in FIG. 11A from the voltage controlled oscillator 55 and further receives the frequency dividing ratio-setting data N0 . . . N6 (1110000B (binary)= 70 H (Hex)) from the CPU 30. Accordingly, when the count values of binary counters 61 and 62 are "7 FH (Hex), 127 (decimal)", the output of the NAND circuit 63 is at a low level, as indicated in FIG. 11B. This low-level output of the NAND circuit 63 is supplied to the FF circuit 64. In this manner, when the count values of binary counters 61 and 62 are "70 H (Hex)", the FF circuit 64 is reset, with the result that the setting output (i.e., frequency divided signal 57a) of the FF circuit 64 is at a low level and the resetting output (i.e., frequency divided signal 57b) thereof is at a high level.

As is shown in FIG. 12, the first frequency divider f6 is made up of a 4-bit binary counter 71, a 4-bit binary counter 72, D-type flip-flop circuits (FF circuits) 73, 74 and 75, NAND circuits 76a, 76b and 76c, a NOR circuit 77, an inverter circuit 78, and decoders 79a and 79b.

Each of the decoders 79a and 79b has a function which is equivalent, for example, to the function of TC74HC138 commercially available from Kabushiki Kaisha Toshiba.

The fundamental clock signal shown in FIG. 14E is supplied from the quarts oscillator 17 to the clock pulse input terminals CP of the binary counters 71, 72 and FF circuit 74.

The frequency divided signal 57b shown in FIG. 14D is supplied from the second frequency divider 57 to the clock pulse input terminal CP of the FF circuit 73.

The resetting output of FF circuit 73 is supplied to one of the two input terminals of the NAND circuit 76b, and the setting output of FF circuit 75 is supplied to the other input terminal of the NAND circuit 76b.

A signal from output terminal e of the decoder 79a (the signal corresponding to count value 126) is supplied to one of the two input terminals of the NAND circuit 76a, and a setting output of the FF circuit 75 is supplied through the inverter circuit 78 to the other input terminal of the NAND circuit 76a. The outputs from the NAND circuits 76a and 76b are supplied through the NOR circuit 77 to the data input terminal D of the FF circuit 74.

The setting output of the FF circuit 74 (the setting output being shown in FIG. 14G) is supplied to the first phase comparator 51 as frequency divided signal 56a, while the resetting output thereof (the resetting output being shown in FIG. 14I) is supplied to the error detecting circuit 58 as frequency divided signal 56b.

The setting output of the FF circuit 74 is also supplied to the clock pulse input terminal CP of the FF circuit 75, the resetting terminal R of the FF circuit 73, and the load terminals L of the binary counters 71 and 72. A selection signal from the selection signal-generating section 59 is supplied to the data input terminal D of the FF circuit 75.

The setting output of the FF circuit 75 (the setting output being shown in FIG. 14H) is supplied to the inverter circuit 78.

Frequency dividing ratio-setting data M6 . . . M0 (a complement of "128") from the CPU 30 are supplied to the data input terminals D2, D1 and D0 of binary counter 72 and the data input terminals D3, D2, D1 and D0 of binary counter 71.

Each of the binary counters 71 and 72 counts up each time a fundamental clock signal is supplied thereto from the quartz oscillator 17, and the count data shown in FIGS. 17A to 17H are output from the output terminals Q0, Q1, Q2 and Q3 of the two binary counters 71 and 72.

Outputs from the output terminals Q0, Q1 and Q2 of binary counter 71 are supplied to the input terminals A, B and C of the decoders 79a and 79b. An output from the output terminal Q2 of binary counter 72 is supplied to the input terminal G1 of the decoder 79a. An output from the output terminal Q3 of binary counter 72 is supplied to both the input terminal G2 of the decoder 79a and the input terminal G1 of the decoder 79b. An output from the output terminal Q3 of binary counter 71 and an output from the output terminal QO of binary counter 72 are supplied to the input terminals G2 and G3 of the decoder 79b. The output from the output terminal Q3 of binary counter 71 and the outputs from the output terminals Q0 and Q1 of binary counter 72 are supplied through the NAND circuit 76c to the input terminal G3 of the decoder 79a.

Outputs from output terminals a to d of the decoders 79a and 79b are supplied to the error detecting circuit 58 as count values. An output from output terminal d of decoder 79a (the output being shown in FIGS. 14F and 17I) is supplied to one of the two input terminals of the NAND circuit 76a.

A power voltage (+5 V) is supplied to the clear terminals CLR of binary counters 71 and 72. The power voltage gradually increases in level to +5 V a certain time after its supply is started, and maintains at +5 V until its supply is stopped.

In the above configuration, the first frequency divider 56 receives the fundamental clock signal shown in FIG. 14E from the quartz oscillator 17 and further receives the frequency dividing ratio-setting data M6 . . . M0 (a complement of "128") from the CPU 30. Accordingly, when the count values of binary counters 71 and 72 are "126)", the output from output terminal e of the decoder 79a is at a low level, as indicated in FIG. 14F. This low-level output from output terminal e of the decoder 79a keeps the FF circuit 74 in the reset condition when the count values of binary counters 71 and 72 are "127". As a result, the setting output (i.e., frequency divided signal 56a) of the FF circuit 74 is at a low level and the resetting output (i.e., frequency divided signal 56b) thereof is at a high level.

Figure 13:
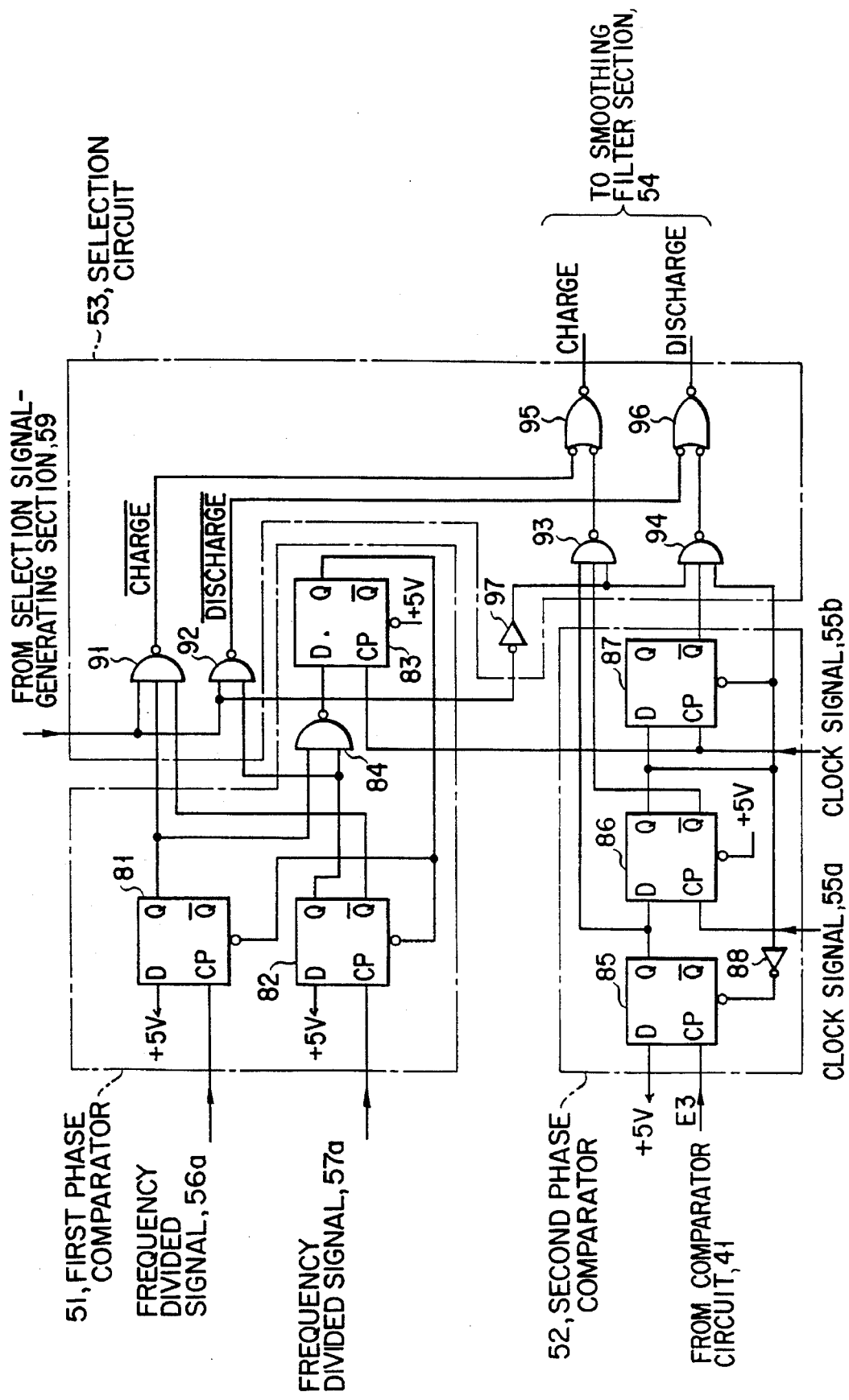
FIG. 13 is a circuit diagram showing examples of specific configurations of the first and second phase comparators and selection circuit depicted in FIG. 9.

As is shown in FIG. 13, the first phase comparator 51 is made up of D-type flip-flop circuits (FF circuits) 81, 82 and 83, and a NAND circuit 84.

The frequency divided signal 56a from the first frequency divider 56 (the frequency divided signal 56a being shown in FIG. 14I) is supplied to the clock pulse input terminal CP of the FF circuit 81.

The frequency divided signal 57a from the second frequency divider 57 (the frequency divided signal 57a being shown in FIG. 14C) is supplied to the clock pulse input terminal CP of the FF circuit 82.

Setting outputs of the FF circuits 81 and 82 are supplied through the NAND circuit 84 to the data input terminal D of the FF circuit 83. The clock signal 55b from the voltage controlled oscillator 55 (the clock signal being shown in FIG. 14J) is supplied to the clock pulse input terminal CP of the FF circuit 83. A setting output of the FF circuit 83 is supplied to the power supply terminals of the FF circuits 81 and 82.

The setting output of the FF circuit 81 and the setting and resetting outputs of the FF circuit 82 are supplied to the selection circuit 53 as output signals of the first phase comparator 51.

The FF circuit 82 is employed for lowering the level of a discharge signal (which is output from a NAND circuit 92 [to be described later] incorporated in the selection circuit 53) for the interval corresponding to one half of the clock signal from the voltage controlled oscillator 55, when both the setting outputs of the FF circuits 81 and 82 are at a high level.

As is shown in FIG. 13, the second phase comparator 52 is made up of D-type flip-flop circuits (FF circuits) 85, 86 and 87, and an inverter circuit 88.

Figure 15:
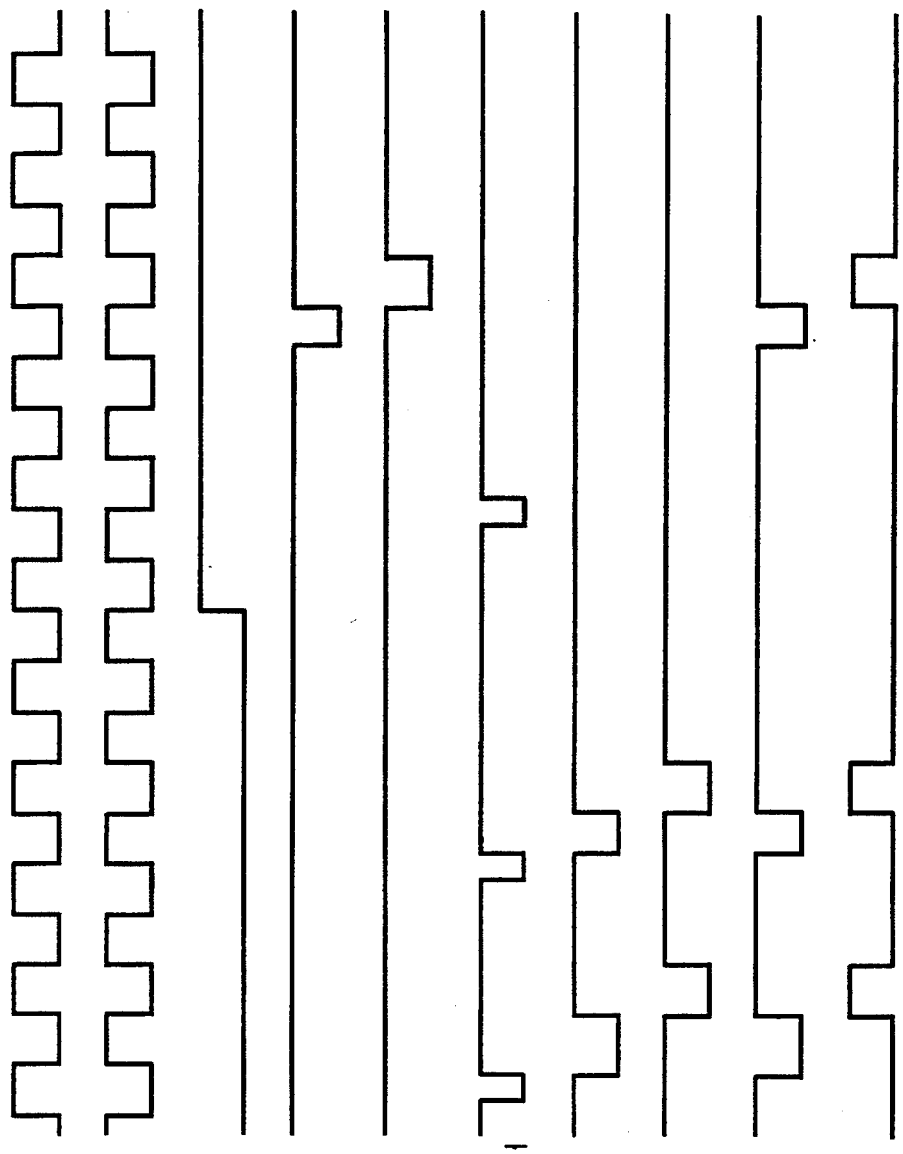
FIGS. 15A–15J show the waveforms at the major portions of the selection circuit depicted in FIG. 13.

A binary signal from the comparator circuit 41 of the data reproducing circuit 18 (the binary signal being shown in FIG. 15F) is supplied to the clock pulse input terminal CP of the FF circuit 85.

Clock signal 55a from the voltage controlled oscillator 55 (the clock signal 55a being shown in FIG. 15A) is supplied to the clock pulse input terminal CP of the FF circuit 86.

Clock signal 55b from the voltage controlled oscillator 55 (the clock signal 55b being shown in FIG. 15B) is supplied to the clock pulse input terminal CP of the FF circuit 87.

A setting output of the FF circuit 85 is supplied to the data input terminal D of the FF circuit 86. A setting output of the FF circuit 86 is supplied to both the data input terminal D and power supply terminal of the FF circuit 87, and is further supplied through the inverter circuit 88 to the power supply terminal of the FF circuit 85.

The setting output of the FF circuit 85, the setting and resetting outputs of the FF circuit 86 and the resetting output of the FF circuit 87 are supplied to the selection circuit 53 as output signals of the second phase comparator 52.

As is shown in FIG. 13, the selection circuit 53 is made up of NAND circuits 91, 92, 93 and 94, AND circuits 95 and 96, and an inverter circuit 97.

A selection signal from the selection signal-generating section 59 (the selection signal being shown in FIG. 15C) is supplied to the first input terminals of the NAND circuits 91 and 92.

The selection signal from the selection signal-generating section 59 is also supplied to the first input terminals of the NAND circuits 93 and 94 by way of the inverter circuit 97.

The setting output of the FF circuit 81 of the first phase comparator 51 is supplied to the second input terminal of the NAND circuit 91. The resetting output of the FF circuit 82 of the first phase comparator 51 is supplied to the third input terminal of the NAND circuit 91. The setting output of the FF circuit 82 of the first phase comparator 51 is supplied to the second input terminal of the NAND circuit 92.

The setting output of the FF circuit 85 of the second phase comparator 52 is supplied to the second input terminal of the NAND circuit 93, and the resetting output of the FF circuit 86 of the second phase comparator 52 is supplied to the third input terminal of the NAND circuit 93. The setting output of the FF circuit 86 of the second phase comparator 52 is supplied to the second input terminal of the NAND circuit 94, and the resetting output of the FF circuit 87 of the second phase comparator 52 is supplied to the third input terminal of the NAND circuit 94.

An output of NAND circuit 91 (the output being shown in FIGS. 14K and 15D) serves as a charge signal and is supplied to one of the two input terminals of the AND circuit 95. An output of NAND circuit 92 (the output being shown in FIGS. 14L and 15E) serves as a discharge signal and is supplied to the one of the two input terminals of the AND circuit 96. An output of NAND circuit 93 (the output being shown in FIG. 15G) serves as a charge signal and is supplied to the other input terminal of the AND circuit 95. An output of NAND circuit 94 (the output being shown in FIG. 15H) serves as a discharge signal and is supplied to the other input terminal of the AND circuit 96.

Outputs of the AND circuits 95 and 96 (the outputs being shown in FIGS. 15I and 15J) serve as charge and discharge signals, respectively, and are supplied to the smoothing filter section 54 as outputs of the selection circuit 53.

Figure 16:
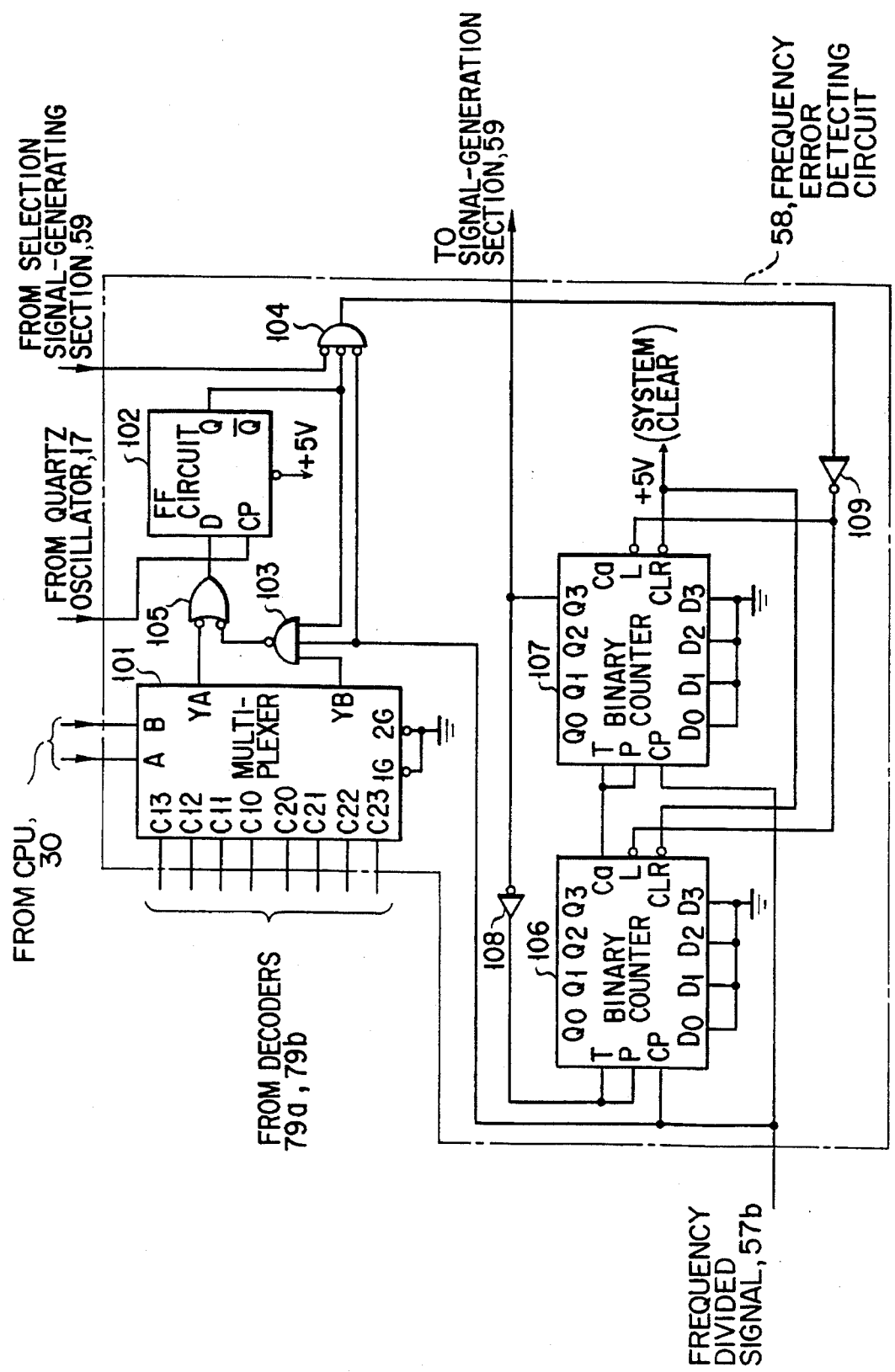
FIG. 16 is a circuit diagram showing an example of a specific configuration of the frequency abnormality-sensing circuit depicted in FIG. 9.

As is shown in FIG. 16, the error detecting circuit 58 is made up of a multiplexer 101, a D-type flip-flop (FF circuit) 102, NAND circuits 103 and 104, a NOR circuit 105, 4-bit binary counters 106 and 107, and inverter circuits 108 and 109.

The multiplexer 101 has a function which is equivalent, for example, to the function of TC74HC153 commercially available from Kabushiki Kaisha Toshiba.

The outputs from output terminals a–d of decoder 79a and outputs a–d of decoder 79b are supplied to the input terminals C13, C12, C11, C10, C20, C21, C22 and C23 of the multiplexer 101, respectively. Check width-setting signals from the CPU 30 are supplied to the input terminals A and B of the multiplexer 101.

Frequency divided signal 57b from the second frequency divider 57 is supplied to the clock pulse input terminals CP of the binary counters 106 and 107, and also to the first input terminals of the NAND circuits 103 and 104.

A fundamental clock signal from the quartz oscillator 17 is supplied to the clock pulse input terminal CP of the FF circuit 102. A selection signal from the selection signal-generating section 59 is supplied to the second input terminal of the NAND circuit 104.

An output from output terminal YA of the multiplexer 101 is supplied to one of the two input terminals of the NOR circuit 105, and output from output terminal YB is supplied to the second input terminal of the NAND circuit 103. An output from the NAND circuit 103 is supplied to the other input terminal of the NOR circuit 105. An output from the NOR circuit is supplied to the data input terminal D of the FF circuit 102, and a setting output from the FF circuit 102 is supplied to both the third input terminal of the NAND circuit 103 and the third input terminal of the NAND circuit 104. Upon detection of an error, the NAND circuit 103 outputs a signal, as indicated in FIG. 18A.

When the check width-setting signals are at level "0" (L2= 0, L1= 0), the setting output signal from the FF circuit 102 has a check width corresponding to three fundamental clocks, as indicated in FIG. 17J. When the check width-setting signals are at level "1" (L2= 0, L1=1), the setting output signal from the FF circuit 102 has a check width corresponding to five fundamental clocks, as indicated in FIG. 17K. When the check width-setting signals are at level "2" (L2= 1, L1= 0), the setting output signal from the FF circuit 102 has a check width corresponding to seven fundamental clocks, as indicated in FIG. 17L. When the check width-setting signals are at level "3" (L2= 1, L1= 1), the setting output signal from the FF circuit 102 has a check width corresponding to nine fundamental clocks, as indicated in FIG. 17M.

Assuming that the frequency dividing ratio is "48", the NAND circuit 103 produces a high-level output signal if an error is outside the range of± 3.1% in the case where the error level is "0", if an error is outside the range of± 5.2% in the case where the error level is "1", if an error is outside the range of± 7.3% in the case where the error level is "2", and if an error is outside the range of±9.4% in the case where the error level is "3".

An output from the NAND circuit 104 is supplied through the inverter circuit 109 to the load terminals of binary counters 106 and 107. An output from the output terminal Q3 of binary counter 107 is supplied to the selection signal-generating section 59 as an error detection signal.

When, as indicated in FIG. 18A, the output from the NAND circuit 104 becomes high in level, the error detection signal has a low level during the period expressed by 127 cy< T< 128 cy, as indicated in FIG. 18C. (In FIG. 18C, Tcy is the period of frequency divided signal 57b of the second frequency divider 57.) As indicated in FIGS. 18B and 18C, the length of time Tcy is M times longer than the period $T_{CR}$ of the fundamental clock signal. When the oscillating frequency of the fundamental clock signals of the quartz oscillator 17 is, for example, 27.84 MHz, the period TCR is 35.9 ns. Therefore, the length of time during which the error detection signal from the output terminal Q3 of the binary counter 107 has a low level is about 182 µs when the frequency dividing ratio M is "40" (3,600 rpm), and is about 219 µs when the frequency dividing ratio M is "48" (3,000 rpm).

The output from the output terminal Q3 of binary counter 107 is also supplied through the inverter circuit 109 to the input terminals T and P of binary counter 106, and an output from the carry output terminal Ca of binary counter 106 is supplied to the input terminals T and P of binary counter 107.

A power voltage (+5 V) is supplied to the clear terminals CLR of binary counters 106 and 107. The power voltage increases in level to +5 V a certain time after its supply is started, and maintains at +5 V until its supply is stopped.

As is shown in FIG. 19, the smoothing filter section 54 is made up of an inverter circuit 110, an analog inversion type amplifier A1, an analog switch SW, diodes D1 and D2, resistors R1, R2, R31 and R32, and capacitors C1 and C2. The analog inversion type amplifier A1 has a function which is equivalent, for example, to the function of TC74HCU04 commercially available from Kabushiki Kaisha Toshiba, and the analog switch SW a function which is equivalent, for example, to the function of TC74HC4066 commercially available from Kabushiki Kaisha Toshiba.

Diode D1 receives a charge signal from the NAND circuit 95 of the selection circuit 53, and diode D2 receives a discharge signal from the NAND circuit 96 of the selection circuit 53.

The resistors R1 and R2, the capacitor C1, and the analog inversion type amplifier A1 jointly constitute a first filter 54a. By this filter 54a, integration is executed with respect to either the charge signal supplied through diode D1 or the discharge signal supplied through diode D2. The analog inversion type amplifier A1 is a CMOS inverter, and its input voltage is in the range of 0 to 5 V. The first filter 54a performs a first-order time lag operation with respect to a low range, and performs zero-order control with respect to a high range. The break frequency is expressed by $1/(2\pi \cdot C1 \cdot R2)$.

The resistors R31 and R32, the capacitor C2, and the analog switch SW jointly constitute a second filter 54b (a lower-pass filter). The second filter 54b does not allow passage of the high-frequency components of signals supplied from the first filter 54a. The cut-off frequency of the second filter 54b is $1/(2\pi \cdot C2 \cdot R31)$ when the analog switch Sw is closed, and is $1/(2\pi \cdot C2 \cdot R3)$ when the analog switch Sw is open (R3: the total resistance of resistors R31 and R32 connected in parallel).

The cut-off frequency of the second filter 54b can be switched between the above two values by changing the level of the selection signal between high and low. Resistor R31 and resister R32 are made to made to satisfy the following resistance relationships: R31= 10π.R32.

When the selection signal is high in level, it is first inverted by the inverter circuit 110 and then supplied to the analog switch SW, thus turning off the analog switch SW. In this case, the cut-off frequency of the second filter 54b takes the value of $1/(2\pi \cdot C2 \cdot R31)$. On the other hand, when the selection signal is low in level, it is first inverted by the inverter circuit 110 and then supplied to the analog switch SW, thus turning off the on switch SW. In this case, the cut-off frequency of the second filter 54b takes the value of $1/(2\pi \cdot C2 \cdot R3)$.

Of the structural components of the smoothing filter section 54, the inverter 110, the analog inversion type amplifier A1 and the analog switch SW are incorporated in the LSI circuit mentioned above, and the diodes D1 and D2, the resistors R1, R2, R31 and R32 and the capacitors C1 and C2 are fabricated as components externally connected to the LSI circuit.

The operation of the subject information recording/reproducing apparatus will now be described. At the time of data recording, a track number and a sector number are supplied from the optical disk control device 36 to the CPU 30 by way of the interface circuit 35 and the bus 29. Simultaneous with this, recording data is supplied from the optical disk control device 36 to the memory 2 by way of the interface circuit 35 and the bus 29. The recording data is temporarily stored in the memory 2.

On the basis of the track number, the CPU 30 identifies a zone, and reads out from the table 2a the frequency dividing value corresponding to the frequency value of the clock signal used for the zone. Further, the CPU 30 outputs a control signal representing the recording time and supplies the control signal to the PLL circuit 16. When the control signal is received by the PLL circuit 16, the selection signal-generating section 59 outputs a low-level selection signal, with the result that a clock signal is supplied to the data reproducing circuit 18. The clock signal uses the pull-in type phase comparator 51 for outputting a signal having a pulse width which is proportional to the phase difference between the signals supplied from the first and second frequency dividers 56 and 57. When the clock signal is supplied to the data reproducing circuit 18, the analog switch SW of the smoothing filter section 54 is turned on, and the cut-off frequency of the second filter 54b takes the value of $1/(2\pi.C2.R3)$.

On the basis of the track number, the CPU 30 controls both the linear motor control circuit 8 and the tracking control circuit 28 in such a manner that the laser beam output from the optical head 5 moves to the track corresponding to the track number (access processing).

In this state, the pre-formatted data (i.e., the header $1_1$ of the track) is read, and a signal representing the read contents is converted into a binary signal by the comparator circuit 41. The binary signal is supplied to the sector mark-detecting circuit 43.

When a sector mark SM is detected, the sector mark-detecting circuit 43 outputs a detection signal. This detection signal is supplied to the address mark-detecting circuit 44, the data mark-detecting circuit 45, the count section 47, and the selection signal-generating section 59 of the PLL circuit 16. The PLL circuit 16 outputs a high-level selection signal generated by the selection signal-generating section 59, and two kinds of clock signals are supplied to the data reproducing circuit 18, the clock signal of one kind is a clock signal 55a supplied from the voltage controlled oscillator 55 and the clock signal of the other kind is a clock signal using the lock-in type phase comparator 52 for outputting a signal having a pulse width which is proportional to the phase difference between the signals supplied from the comparator circuit 41. At the time, the analog switch SW of the smoothing filter section 54 is turned off, and the cut-off frequency of the second filter 54b takes the value of $1/(2\pi.C2.R31)$.

A signal obtained by reading the synchronization code section VFO is converted into a binary signal, and this binary signal is supplied to the phase comparator 52. Thus, the clock signal corrected in accordance with the synchronization code of the synchronization code section VFO is output from the PLL circuit 16 and supplied to the data reproducing circuit 18.

Then, an address mark is detected by the address mark-detecting circuit 44. A detection signal output from the address mark-detecting circuit 44 is supplied to the address detecting circuit 46. The address detecting circuit 46 reproduces address information (namely, a track number and a sector number) in accordance with both the binary signal produced by the second phase comparator 52 of the PLL circuit 16 and the clock signal supplied from the PLL circuit 16. The reproduced track number and sector number are output to the CPU 30.

The CPU 30 determines whether the reproduced track and sector numbers coincide with those of the recording position. When no coincidence is detected, the access processing mentioned above is repeated.

When coincidence is detected, the CPU 30 causes the error correction circuit 32 to attach an error correction code ECC to the recording data stored in the memory 2. Further, a synchronization code for PLL locking and a data mark are attached to the area preceding the recording data, and the resultant data are supplied to the laser control circuit 13.

When the count section 47 outputs an end position signal, the selection signal-generating section 59 of the PLL circuit 16 outputs a low-level selection signal. Therefore, a clock signal using the pull-in type phase comparator 51 is supplied to both the modulation circuit 14 and laser driving circuit 15 of the laser control circuit 13.

As a result, the synchronization code for PLL locking, the data mark and the recording data supplied from the error correction circuit 32 are modulated by the modulation circuit 14. The semiconductor laser oscillator 19 of the optical head 5 is driven in accordance with the modulated data and the clock signal supplied from the PLL circuit 16.

In this manner, the synchronization code for PLL locking, the data mark and the recording data are recorded in the data area that follows the header 1 of the optical disk 1.

At the time of data reproduction, a track number and a sector number are supplied from the optical disk control device 36 to the CPU 30 by way of the interface circuit 35 and the bus 29.

On the basis of the track number, the CPU 30 identifies an area, and reads out from the table 2a the frequency dividing value corresponding to the clock frequency value used for the area. The readout frequency dividing value is supplied to the first and second frequency dividers 56 and 57 of the PLL circuit 16. Further, the CPU 30 outputs a control signal representing the reproduction time and supplies the control signal to the PLL circuit 16. When the control signal is received by the PLL circuit 16, the selection signal-generating section 59 outputs a low-level selection signal, with the result that a clock signal is supplied to the data reproducing circuit 18. The clock signal uses the pull-in type phase comparator 51 for outputting a signal having a pulse width which is proportional to the phase difference between the signals supplied from the first and second frequency dividers 56 and 57. When the clock signal is supplied to the data reproducing circuit 18, the analog switch SW of the smoothing filter section 54 is turned on, and the cut-off frequency of the second filter 54b takes the value of $1/(2\pi.C2.R3)$.

On the basis of the track number, the CPU 30 controls both the linear motor control circuit 8 and the tracking control circuit 28 in such a manner that the laser beam output from the optical head 5 moves to the track corresponding to the track number (access processing).

In this state, the pre-formatted data (i.e., the header $1_1$ of the track) is read, and a signal representing the read contents is converted into a binary signal by the comparator circuit 41. The binary signal is supplied to the sector mark-detecting circuit 43.

When a sector mark SM is detected, the sector mark-detecting circuit 43 outputs a detection signal. This detection signal is supplied to the address mark-detecting circuit 44, the data mark-detecting circuit 45, the count section 47, and the selection signal-generating section 59 of the PLL circuit 16. The PLL circuit 16 outputs a high-level selection signal generated by the selection signal-generating section 59, and a clock signal using the lock-in type phase comparator 52 is supplied to the data reproducing circuit 18. At the time, the analog switch SW of the smoothing filter section 54 is turned off, and the cut-off frequency of the second filter 54b takes the value of $1/(2\pi.C2.R31)$.

A signal obtained by reading the synchronization code section VFO is converted into a binary signal by the comparator circuit 41, and this binary signal is supplied to the phase comparator 52. Thus, the clock signal corrected in accordance with the synchronization code of the synchronization code section VFO is output from the PLL circuit 16 and supplied to the data reproducing circuit 18.

Then, an address mark is detected by the address mark-detecting circuit 44. A detection signal output from the address mark-detecting circuit 44 is supplied to the address detecting circuit 46. The address detecting circuit 46 reproduces address information (namely, a track number and a sector number) in accordance with both the binary signal produced by the second phase comparator 52 of the PLL circuit 16 and the clock signal supplied from the PLL circuit 16. The reproduced track number and sector number are output to the CPU 30.

The CPU 30 determines whether the reproduced track and sector numbers coincide with those of the recording position. When no coincidence is detected, the access processing mentioned above is repeated.

When coincidence is detected, the CPU 30 uses, as reproducing data, the data demodulated by the demodulation circuit 42. The demodulated data is first subjected to error correction by the error correction circuit 32, and is then supplied to the optical disk control device 36 by way of the bus 32 and the interface circuit 35.

When a data mark is detected by the data mark-detecting circuit 45 after the detection of the sector mark, a detection signal output from the data mark-detecting circuit 45 is supplied to the demodulation circuit 42. After the supply of the detection signal, the demodulation circuit 42 demodulates the binary signal from the comparator circuit 41 by 2-7 code reverse conversion on the basis of the clock signal supplied from the PLL circuit 16. The demodulated signal, i.e., a reproduced signal, is supplied to the error correction circuit 32.

If, at the time of data reproduction, the timing at which clock signals are output from the PLL circuit 16 deviates from the clock frequency value of the area which is being accessed, an error detection signal which the error detecting circuit 58 outputs for a predetermined length of time is supplied to the selection signal-generating section 59. As a result, the selection signal-generating section 59 keeps outputting a low-level selection signal for the same length of time, and the clock signal using the pull-in type phase comparator 51 is supplied to the data reproducing circuit 18.

After the predetermined length of time, the selection signal-generating section 59 starts outputting a high-level selection signal again, and the clock signal using the lock-in type phase comparator 52 is supplied to the data reproducing circuit 18.

At the time of data reproduction, clock signals using the lock-in type phase comparator 52 are output from the PLL circuit. Even if the timing at which the clock signals are output deviates from the clock frequency value of the area which is being accessed, this deviation can be corrected, as can be seen from the above.

The above embodiment was described, referring to the case where an optical disk was employed. However, the present invention is not limited to this, and can be reduced to practice in the case where a magneto-optic disk is employed in place of the optical disk.

In addition, the recording system is not limited to the 2-7 code modulation system mentioned above; it may be a 1-7 code modulation system instead.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A data recording/reproduction apparatus comprising:

first output means for outputting a clock signal which is used as a reference when data is recorded on a recording medium and when data is reproduced therefrom;

data recording/reproducing means for recording and reproducing data with respect to the recording medium on the basis of the clock signal output from the first output means;

second output means for outputting a fundamental clock signal;

first comparison means for comparing a phase of the fundamental clock signal output from the second output means with a phase of the clock signal output from the first output means, and for producing an output signal based on a phase difference;

second comparison means for comparing a phase of a reproduction signal output from the data recording/reproducing means with the phase of the clock signal output from the first output means, and for producing an output signal based on a phase difference; and control means for controlling the first output means to output a clock signal having a period based on the output signal of the first comparison means when data is recorded on the recording medium by the data recording/reproducing means, and for controlling the first output means to output a clock signal having a period based on the output signal of the second comparison means when data is reproduced from the recording medium by the data recording/reproducing means.

2. A data recording/reproducing apparatus wherein data is recorded on a disk by means of an optical head and reproduced from the disk by means of the optical head, said disk is rotated at a constant speed and has zones each of which includes a plurality of tracks and for which recording and reproducing clock signals having different frequencies are used, each of said tracks has pre-formatted data including sector mark data, synchronization code data and address information, and said optical head is moved in a radial direction of the optical disk by a head moving means so as to access a target zone, said data recording/reproducing apparatus comprising:

storage means for storing frequency data on the recording and reproducing clock signals used for each of the zones;

first output means for outputting a clock signal which is used as a reference when data is recorded on the disk and when data is reproduced therefrom;

data recording/reproducing means for recording and reproducing data with respect to the disk on the basis of the clock signal output from the first output means;

second output means for reading out, from the storage means, frequency data corresponding to a zone with respect to which data is processed, and for outputting a fundamental clock signal based on the frequency data read out from the storage means;

first comparison means for comparing a phase of the fundamental clock signal output from the second output means with a phase of the clock signal output from the first output means, and for producing an output signal based on a phase difference;

second comparison means for comparing a phase of a reproduction signal output from the data recording/ reproducing means with the phase of the clock signal output from the first output means, and for producing an output signal based on a phase difference; and control means, operating in a case where data is recorded on the disk, for controlling the first output means to output a clock signal having a period based on the output signal of the second comparison means when processing is performed with respect at least to synchronization code sections and address section of the pre-formatted data, and for controlling the first output means to output a clock signal having a period based on the output signal of the first comparison means when processing is performed with respect to other sections of the pre-formatted data.

* * * * *